United States Patent
Tanaka

(10) Patent No.: US 8,026,116 B2
(45) Date of Patent: Sep. 27, 2011

(54) DISPLAY DEVICE AND METHOD OF MANUFACTURING THE SAME

(75) Inventor: Tsutomu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/728,173

(22) Filed: Mar. 23, 2007

(65) Prior Publication Data

US 2007/0181885 A1    Aug. 9, 2007

Related U.S. Application Data

(60) Continuation of application No. 10/899,689, filed on Jul. 27, 2004, now Pat. No. 7,205,172, which is a division of application No. 10/442,374, filed on May 21, 2003, now Pat. No. 6,888,164.

(30) Foreign Application Priority Data

May 24, 2002   (JP) ................................. 2002-151322

(51) Int. Cl.
   *H01L 21/00*   (2006.01)
(52) U.S. Cl. ..... 438/30; 438/151; 257/72; 257/E21.414; 257/E27.113
(58) Field of Classification Search ............ 257/E21.414
   See application file for complete search history.

(56) References Cited

U.S. PATENT DOCUMENTS

| 5,526,012 | A | 6/1996 | Shibahara |
| 6,040,200 | A | 3/2000 | Hayashi et al. |
| 6,246,070 | B1* | 6/2001 | Yamazaki et al. ............. 257/40 |
| 6,358,766 | B1* | 3/2002 | Kasahara ...................... 438/30 |
| 7,102,161 | B2 | 9/2006 | Inukai |
| 2002/0039813 | A1* | 4/2002 | Yamazaki ................... 438/151 |
| 2002/0139978 | A1* | 10/2002 | Yamazaki et al. ............ 257/69 |

FOREIGN PATENT DOCUMENTS

| JP | 07-146489 | 6/1995 |
| JP | 08-292449 | 11/1996 |
| JP | 2002-006341 | 1/2002 |
| WO | WO 01/33292 | 5/2001 |

* cited by examiner

*Primary Examiner* — Ha Tran T Nguyen
*Assistant Examiner* — Shaka Scarlett
(74) *Attorney, Agent, or Firm* — Robert J. Depke; Rockey, Depke & Lyons, LLC

(57) ABSTRACT

Disclosed herein is a display device, including a display element, a first scanning line, a second scanning line, a data signal line, a switching element having a first terminal and a second terminal of a first conduction type, the first terminal being connected to the data signal line, for being held in a conducting state or a non-conducting state according to a voltage applied to the first scanning line, and a storage capacitance having a first electrode and a second electrode that shares the second scanning line, wherein the second terminal of the switching element is connected to the display element and connected to the first electrode of the storage capacitance including a semiconductor film of a second conduction type different from the second terminal.

4 Claims, 20 Drawing Sheets

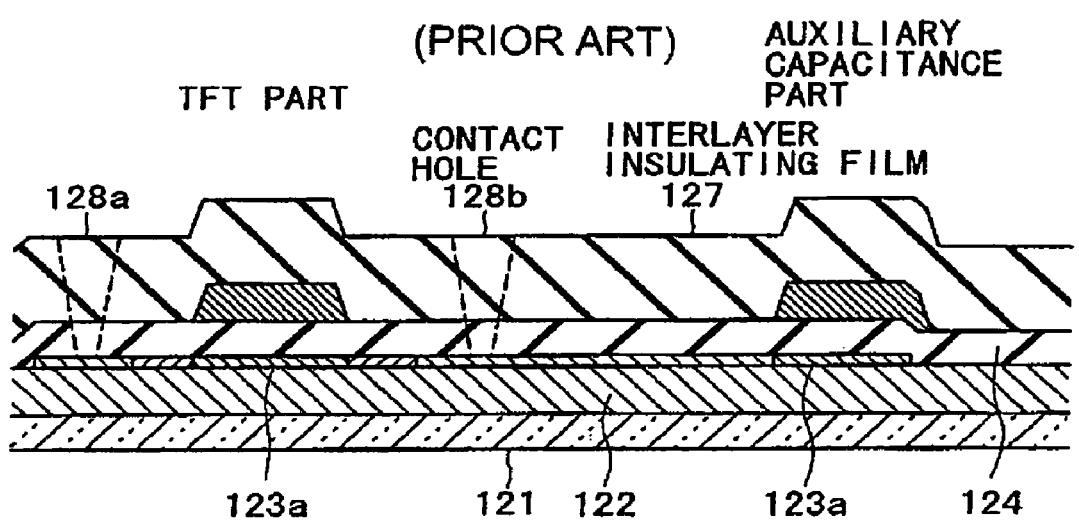
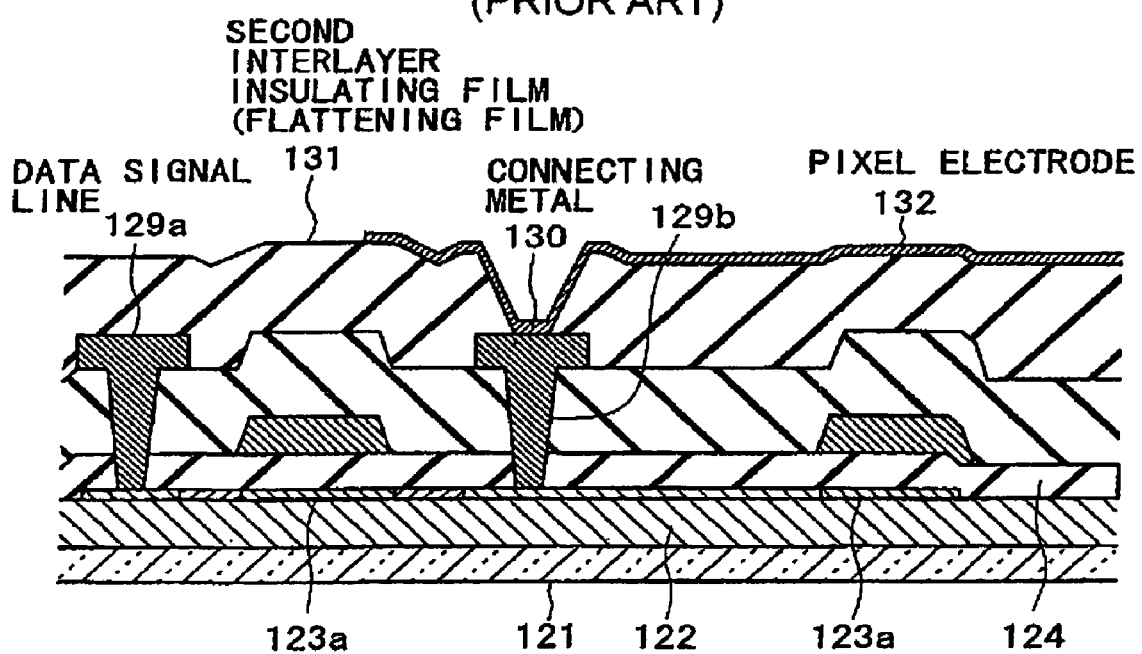

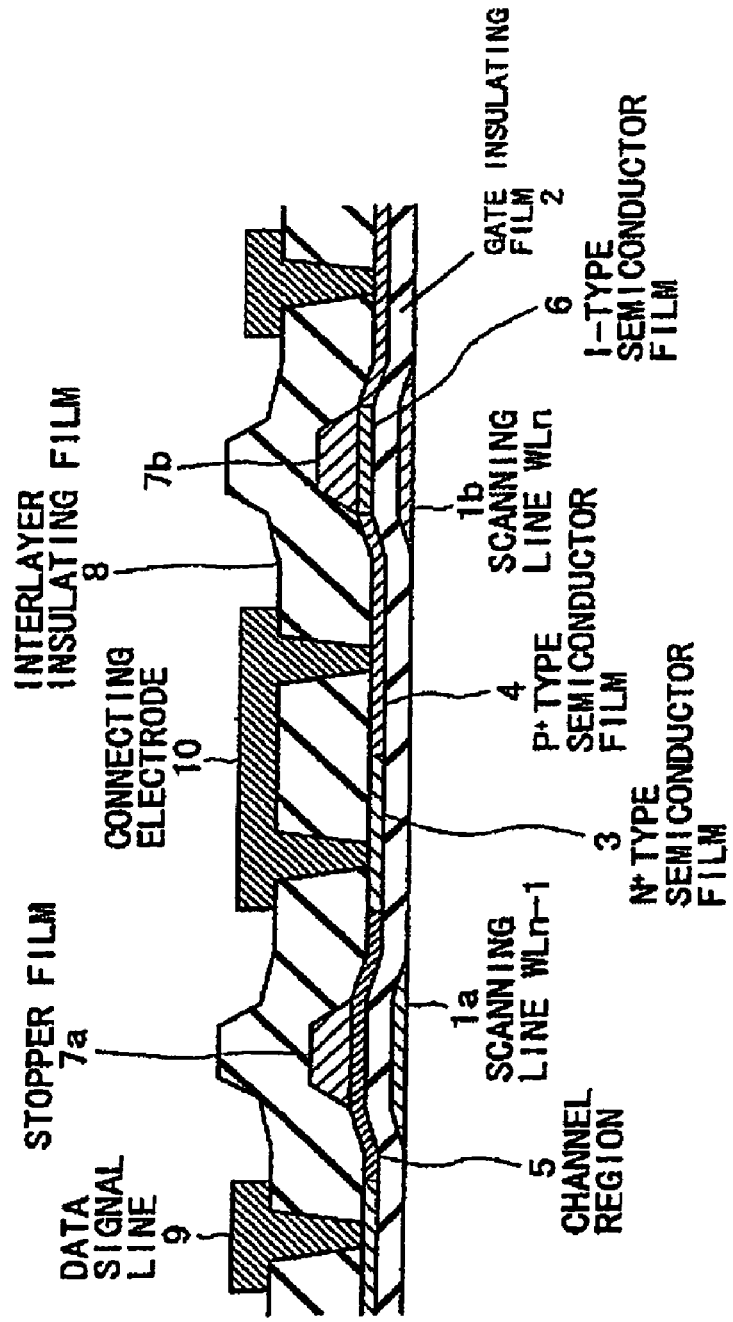

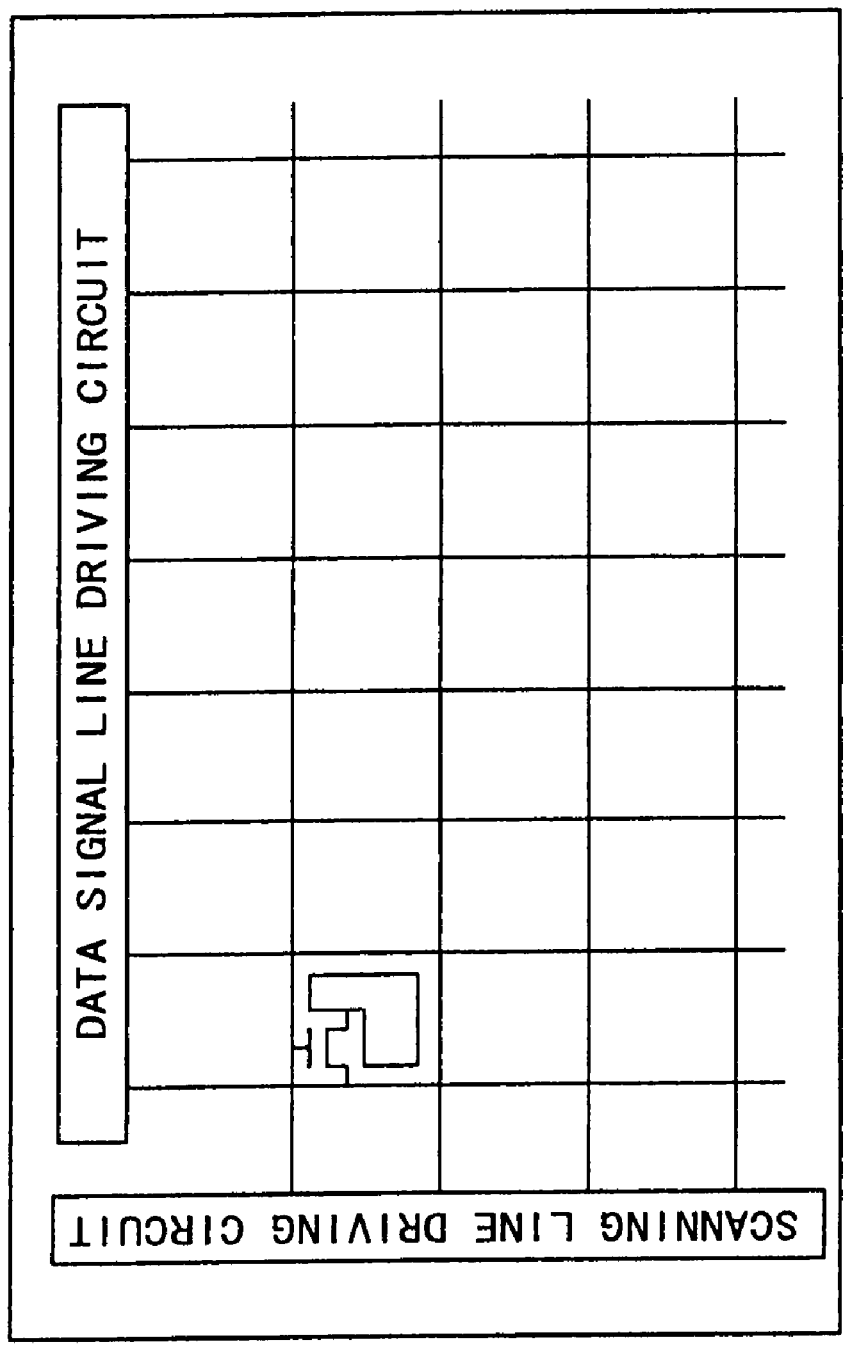

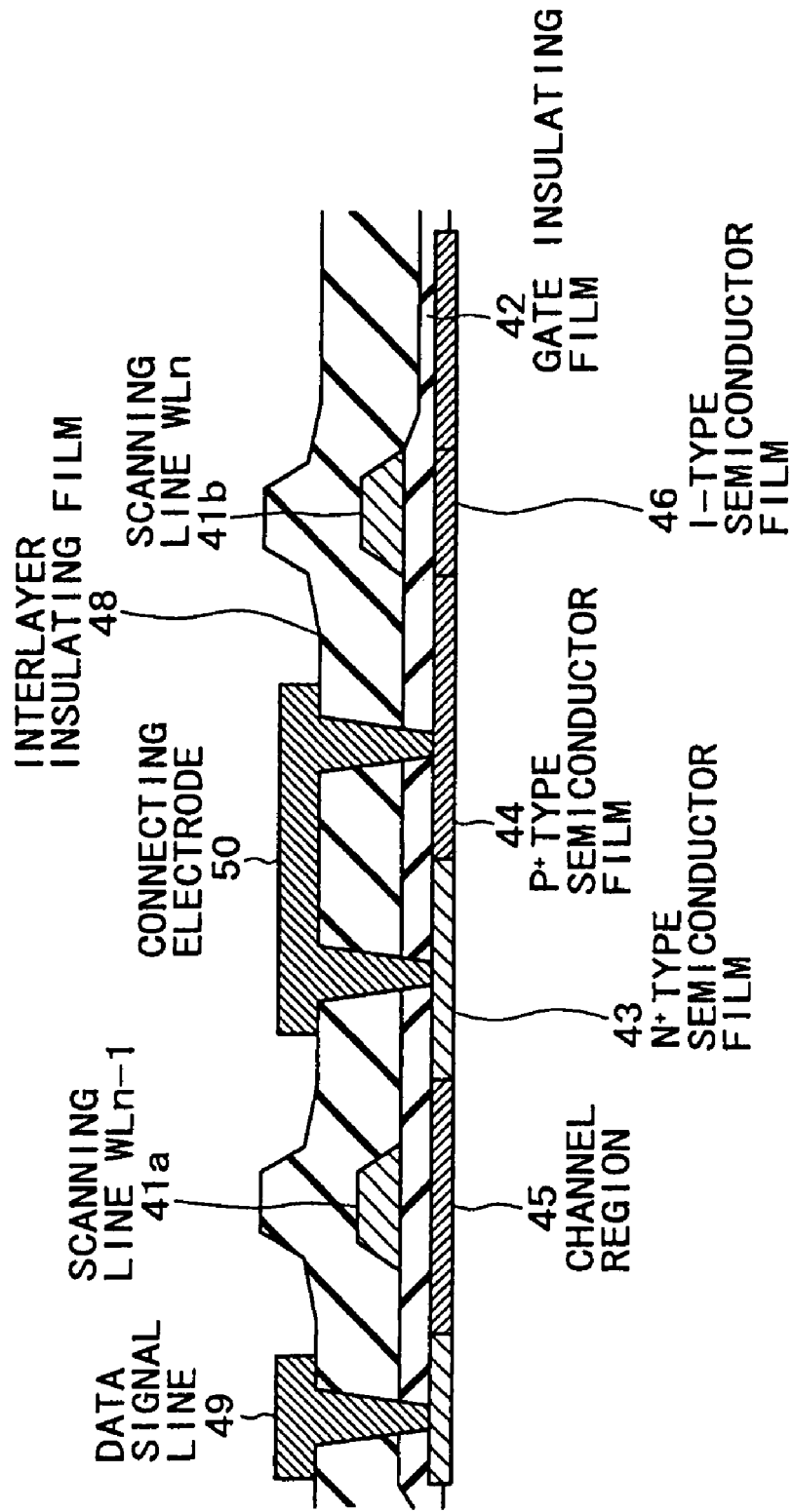

DISPLAY DEVICE AND METHOD OF MANUFACTURING THE SAME

The subject matter of application Ser. No. 10/899,689 is incorporated herein by reference. The present application is a continuation of U.S. application Ser. No. 10/899,689, filed Jul. 27, 2004 now U.S. Pat. No. 7,205,172, which is a Divisional of U.S. application Ser. No. 10/442,374, filed May 21, 2003 now U.S. Pat. No. 6,888,164, which claims priority to Japanese Patent Application No. JP2002-151322, filed May 24, 2002. The present application claims priority to these previously filed applications.

BACKGROUND OF THE INVENTION

The present invention relates to a display device and a method of manufacturing the same, and particularly to a liquid crystal display device and a method of manufacturing the same.

With characteristics of being thin and low power consumption, liquid crystal display devices are widely used in notebook computers, display devices for car navigation, personal digital assistants (PDAs), portable telephones and the like. The liquid crystal display device is roughly classified into a transmissive type that controls light from a backlight for display, a reflective type that reflects extraneous light such as sunlight or the like for display, or a recent display device referred to as a transflective type that combines characteristics of both the transmissive type and the reflective type.

Applications of these display devices require that the display devices consume low power, and therefore a high aperture ratio is required to maximize efficiency of use of the backlight. In the transflective type, a transmission part and a reflection part are formed in the same pixel, and thus multiple functions are incorporated within the pixel; it is therefore necessary to use space as effectively as possible.

In displaying an image on a liquid crystal display device, a scanning pulse is applied from a scanning line to a switching element, for example a TFT (Thin Film Transistor) provided for each pixel, and the switching element is turned on/off, whereby display pixels are selected. A signal corresponding to a video signal is applied to a data line, and then applied via a source and a drain of the TFT to electrodes that have a liquid crystal sandwiched therebetween, whereby light entering the liquid crystal is modulated to display the image.

Within a period until a next writing operation after a voltage corresponding to the video signal is written to each pixel, charge resulting from the voltage applied to the electrodes of the liquid crystal leaks through the liquid crystal and the switching element and is thus changed. In order to insure display picture quality, the applied voltage needs to be retained. Accordingly, an auxiliary capacitance (CS) sufficient as compared with the amount of leakage is generally formed in the liquid crystal display device.

FIG. 1 is an example of an equivalent circuit diagram of a conventional liquid crystal display device. FIG. 2 is a plan view of a configuration of the liquid crystal display device shown in FIG. 1.

FIG. 1 shows an equivalent circuit of 2×3 pixels. One pixel in the equivalent circuit includes a liquid crystal element and electrodes having the liquid crystal element sandwiched therebetween, a transistor Tr as a switching element, and an auxiliary capacitance CS. Ccl1 to Ccl6 denotes a capacitance of a liquid crystal capacitor formed by a liquid crystal element and a display electrode and a common electrode having the liquid crystal element sandwiched therebetween. CS1 to CS6 denotes a capacitance value of the auxiliary capacitance of each pixel.

A plurality of scanning lines WLn−1, WLn, and WLn+1 are arranged in parallel with each other, and each connected to gate electrodes of transistors Tr1 and Tr4, transistors Tr2 and Tr5, or transistors Tr3 and Tr6 formed by TFTs, for example. The scanning lines WLn−1, WLn, and WLn+1 effect ON/OFF control of each of the transistors and thereby select pixels.

Data signal lines BLn−1, BLn, and BLn+1 arranged in parallel with each other apply a voltage corresponding to a video signal to each pixel. The data signal lines BLn−1, BLn, and BLn+1 are connected to for example a source region of the transistors Tr1, Tr2, and Tr3 or the transistors Tr4, Tr5, and Tr6. The data signal lines BLn−1, BLn, and BLn+1 apply voltage to electrodes on both sides of liquid crystal elements in pixels selected by the scanning line WLn−1, WLn, or WLn+1 while charging auxiliary capacitances CS in the pixels, whereby light entering the liquid crystal elements is modulated to display an image.

FIG. 2 is a view of the configuration of scanning lines, data signal lines, and one pixel formed on a transparent substrate. As shown in FIG. 2, the auxiliary capacitance CS1 is formed on an auxiliary capacitance line CSLn−1 as one electrode of the auxiliary capacitance CS1. One impurity region, for example the source region of the transistor Tr1 is connected to the data signal line BLn−1 via a conductive material deposited in a contact hole H1. Another impurity region, for example a drain region of the transistor Tr1 is connected to another electrode formed by a semiconductor, for example, of the auxiliary capacitance CS1 and an ITO electrode of an upper layer not shown in the figure via conductive material deposited in contact holes H2 and H3.

An N-channel type thin film transistor TFT is generally used as the transistors Tr1, . . . , Tr6. Specifically, N-type source and drain impurity regions are formed by injecting phosphorus (P) or the like into semiconductor thin film on both sides of a gate electrode. When a positive voltage equal to or higher than a threshold value is applied to the gate electrode (scanning line), an N-channel formed by an N-type inversion layer is formed between the source and the drain, whereby the source and the drain are electrically connected to each other. That is, the transistor is in an ON state. When a voltage lower than the threshold value is applied to the gate electrode (scanning line), on the other hand, the channel for electrically connecting the source and the drain to each other is hot formed, and therefore the transistor is in an OFF state.

The auxiliary capacitance CS1 is generally formed by a MOS structure of a semiconductor layer, an insulating film, and a metal, which structure can form a highest capacitance. In FIG. 2, the auxiliary capacitance CS1 is for example formed by the auxiliary capacitance line CSLn−1 (metal), a gate insulating film forming the transistor Tr1, and the abovementioned N-type semiconductor film having phosphorus or the like injected therein. Such a MOS capacitance will hereinafter be referred to as an N-type MOS structure.

When the electrodes of the auxiliary capacitance are to be set at a fixed potential, the auxiliary capacitance portion is generally made to be of the N-type MOS structure.

In a case of common-inversion driving in which auxiliary capacitance electrodes are oscillated in phase with a counter electrode, the semiconductor film forming the auxiliary capacitance CS does not form a sufficient capacitance in an intrinsic state. Therefore, the semiconductor layer is generally metalized, that is, made to contain a high concentration of phosphorus (made to be of an N+ type) or boron (made to be of a P+ type).

With the above conventional method, high-concentration injection of phosphorus (allowing the semiconductor layer to be of the N+ type) or boron (allowing the semiconductor layer to be of the P+ type) is required to be performed only once, and therefore manufacturing cost can be reduced.

However, the above structure requires an independent auxiliary capacitance line, thus presenting a problem of a decrease in an aperture ratio.

Accordingly, a CS-on-gate structure is proposed in which a scanning line (gate line) in a preceding stage or a succeeding stage also serves as the auxiliary capacitance line.

FIGS. 3A and 3B show another example of a conventional liquid crystal display device. FIG. 3A is an equivalent circuit diagram of the liquid crystal display device, and FIG. 3B is a plan view of a configuration of the liquid crystal display device. In FIGS. 3A and 3B, the same components as in FIG. 1 are designated by using the same reference numerals, and their repeated description will be omitted where appropriate.

FIG. 3A shows an equivalent circuit of 2×2 pixels. In FIG. 3A, auxiliary capacitances CS1, CS4, CS2, and CS5 are directly connected to scanning lines WLn−1, WLn, and WLn+1 in place of the auxiliary capacitance lines CSLn−1, CSLn, and CSLn+1 shown in FIG. 1.

FIG. 3B shows a configuration of scanning lines, data signal lines, and one pixel formed on a transparent substrate. The auxiliary capacitance CS1 is formed so as to overlap the scanning line WLn in place of the auxiliary capacitance line CSLn−1 shown in FIG. 2.

Also in this case, an N-channel type thin film transistor TFT is generally used as transistors Tr1, . . . , Tr6. Also, the auxiliary capacitance CS1 is an N-type MOS capacitance. Specifically, when a positive voltage equal to or higher than a threshold value is applied to gate electrodes (scanning lines) of the transistors Tr1, . . . , Tr6, the transistors Tr1, . . . , Tr6 are brought into an ON state. When a voltage lower than the threshold value is applied to the gate electrodes, the transistors Tr1, . . . , Tr6 are brought into an OFF state.

As shown in FIG. 3B, the auxiliary capacitance CS1 is formed by the scanning line WLn (metal), a gate insulating film forming the transistor Tr1, and an N-type semiconductor film having phosphorus or the like injected therein.

Such a CS-on-gate structure eliminates the need for forming the independent auxiliary capacitance line, and therefore has an advantage of increasing the aperture ratio.

In order to maintain the NMOS transistor Tr1 in an off state, the potential of the scanning lines WLn−1, WLn, . . . may generally be set to about 0 V to −6 V. In addition, the transistor Tr1 in the liquid crystal display device is maintained in the OFF state during most of a period of display of one screen. That is, the potential of the scanning lines is maintained at 0 V or lower during most of the display period.

However, in the case of the CS-on-gate structure as shown in FIGS. 3A and 3B, in which structure the auxiliary capacitance CS1 is formed with the scanning line (gate line) WLn in the succeeding stage, for example, and the potential as described above is applied, the N-type MOS structure formed by the scanning line, the gate insulating film, and the N-type semiconductor film cannot provide a sufficient capacitance.

FIG. 4 is a graph showing capacitance-voltage characteristics of the N-type MOS structure.

When −2 V, for example, is applied to the scanning lines WLn−1 and WLn shown in FIG. 3B and thereby Tr1 is maintained in an OFF state, since CS1 is charged while Tr1 is in an ON state, the semiconductor electrode of CS1 is at a higher potential than the scanning lines WLn−1 and WLn, and the gate voltage applied to CS1 is a negative voltage. This causes majority carrier electrons to be repelled from a surface of the semiconductor film and a depletion layer (and/or an inversion layer) to be formed on the surface of the semiconductor film, which corresponds to an increase in thickness of the insulating layer of CS1. Thus, a resulting capacitance is small.

This tendency is shown in FIG. 4. When the scanning potential is used in a range of about 1.5 V and lower, only a small capacitance is provided by the N-type MOS capacitance at all times.

In order to increase the capacitance of the auxiliary capacitance CS1, phosphorus (for making an N+ type) or boron (for making a P+ type) needs to be injected at a high concentration into the semiconductor film electrode of the auxiliary capacitance CS1. This causes problems of an increase in the number of processes, a decrease in yield resulting from occurrence of defects, and the like.

FIGS. 5A to 7B illustrate an example of a process of manufacturing the conventional liquid crystal display device.

In FIG. 5A, gate electrodes (scanning lines) 102a and 102b serving as scanning lines are formed on a glass substrate 101. A metal such as Ta, Cr, Mo, Ti, Al or the like is used for the material of the gate electrodes, and the pattern is formed by wet etching or dry etching following a photoresist process.

In FIG. 5B, an gate insulating film 103 and a semiconductor layer 104a are formed over the gate electrodes 102a and 102b. Examples of the gate insulating film 103 include silicon nitride film and silicon oxide film, as well as anodized film obtained by anodizing a gate electrode and the like. As the semiconductor film, amorphous silicon film, polysilicon film obtained by crystallizing amorphous silicon film, polysilicon film formed directly, or the like is used.

In FIG. 5C, a protective insulating film 105 is formed on the semiconductor film 104a. As the protective insulating film 105, silicon nitride film, silicon oxide film or the like is used.

In FIG. 5D, resists 107a and 107b are formed in a self-aligning manner with the gate electrodes 102a and 102b serving as a light shield mask. The protective insulating film 105 is thereafter removed by wet etching or dry etching. Then, using remaining protective insulating films 105a and 105b as a mask, the semiconductor film is doped with phosphorus (P) or the like at a low concentration. A doped portion of the semiconductor film is denoted as 104b. The semiconductor film 104b is an n⁻ type semiconductor.

In FIG. 6A, a resist 108 having such a shape as to cover a portion forming an LDD region in the pixel transistor is formed. In order to remove the protective insulating film 105b remaining in a portion where the auxiliary capacitance is formed, wet etching or dry etching is thereafter performed.

Then, phosphorus or the like is injected at a high concentration to thereby metalize the semiconductor layer 104b. A metalized portion of the semiconductor film 104b is denoted as 104c.

Though not shown in the figures, a photoresist process and an injection process are carried out according to a portion for injection of a second type of dope (boron or the like). Thereafter heat treatment is performed as required to activate doped elements.

The wet etching or the dry etching is usually performed by a process with etching selectivity to protect the semiconductor layer 104b from the etching. However, when there is a pin hole or the like in the semiconductor layer 104b, the gate insulating film 103 serving as a base is etched. The etched portion, being greatly deteriorated in terms of withstand voltage, forms a path of current leakage, and causes a defect such as a point defect or the like. Besides, the process for removing the protective insulating film 105b is added, which represents a cost increasing factor.

In FIG. 6B, for device isolation, the semiconductor layer 104c on the outside of the gate electrodes 102a and 102b is removed using means such as photolithography, dry etching or the like.

In FIG. 6C, an interlayer insulating film 109 is formed by silicon nitride film, silicon oxide film or the like. Thereafter contact holes 110a and 110b are formed using means such as photolithography, wet etching or the like.

In FIG. 7A, a metal such as Al, Ta, W or the like is formed as data signal lines 111a and 111b and a connecting metal 112 for connection with a pixel electrode. Thereafter the metal is removed using means such as photolithography, dry etching or the like, whereby a pattern is formed.

In FIG. 7B, a second interlayer insulating film 113 is formed by silicon nitride film, silicon oxide film or the like. In order to provide this layer with a flattening effect, a photosensitive organic film, a photosensitive SOG (spin on glass) film or the like may be used. Also in this process, a contact hole for connection with the pixel electrode 114 is formed. Thereafter the pixel electrode 114 is formed using a transparent conductive film of ITO, IXO or the like.

Then, though not shown in the figures, a corresponding color filter substrate prepared separately is superposed on the TFT substrate, an assembly process is carried out with a liquid crystal layer sandwiched between the color filter substrate and the TFT substrate, and further a polarizer and the like are attached, whereby the liquid crystal display device is completed.

Thus, with the conventional manufacturing method, special process is required to complete the structure of the auxiliary capacitance, which constitutes a cost increasing factor, and also leakage current that causes defects is increased. There are conventionally problems of such an increase in the number of processes and a decrease in yield resulting from occurrence of defects.

While a conventional example of the bottom gate type transistor in which the scanning line (gate electrode) is formed under the semiconductor layer has been described above, there are also problems in a method of manufacturing the top gate type transistor in which the scanning line (gate electrode) is formed above the semiconductor layer.

FIGS. 8A, 8B, and 8C and FIGS. 9A and 9B illustrate a conventional example of a method of manufacturing a liquid crystal display device having the structure of the top gate type transistor.

As shown in FIG. 8A, a base layer 122 and a semiconductor layer 123a are formed on a glass substrate 121. As the base layer 122, silicon nitride film or silicon oxide film, for example, is used. As the semiconductor layer 123a, amorphous silicon film, polysilicon film obtained by crystallizing amorphous silicon film, polysilicon film formed directly, or the like is used.

As shown in FIG. 8B, in order to obtain a region for device isolation, a part of the semiconductor layer 123a is removed using means such as photolithography, dry etching or the like.

A gate insulating film 124 is then formed on the semiconductor film 123a. Examples of the gate insulating film include silicon nitride film, silicon oxide film and the like.

Then, gate electrodes 125a and 125b are formed in a region for forming a transistor TFT and a region for forming an auxiliary capacitance.

Next, the semiconductor film is doped with phosphorus or the like at a low concentration in a self-aligning manner with the gate electrodes 125a and 125b serving as an injection mask. A doped portion of the semiconductor film is an $n^-$ type semiconductor, and is denoted as 123b.

As shown in FIG. 8C, a resist 126 having such a shape as to cover a portion forming an LDD region in the pixel transistor TFT is formed. Phosphorus or the like is injected into other regions at a high concentration to thereby metalize the semiconductor layer 123b. The metalized portion of the semiconductor film 123b is denoted as 123c.

Though not shown in the figures, a photoresist process and an injection process are carried out according to a portion for injection of a second type of dope (boron or the like). Thereafter heat treatment is performed as required to activate doped elements.

In FIG. 9A, an interlayer insulating film 127 is formed by silicon nitride film, silicon oxide film or the like. Thereafter contact holes 128a and 128b are formed using means such as photolithography, wet etching or the like.

In FIG. 9B, a metal such as Al, Ta, W or the like is formed as data signal lines 129a and 129b and a connecting metal 130 for connection with a pixel electrode 132. Thereafter the metal is removed using means such as photolithography, dry etching or the like, whereby a pattern is formed.

Then, a second interlayer insulating film 131 is formed by silicon nitride film, silicon oxide film or the like. In order to provide this layer with a flattening effect, a photosensitive organic film, a photosensitive SOG (spin on glass) film or the like may be used. Also in this process, a contact hole for connection with the pixel electrode 132 is formed. Thereafter the pixel electrode 132 is formed using a transparent conductive film of ITO, IXO or the like.

Then, though not shown in the figures, a corresponding color filter substrate prepared separately is superposed on the TFT substrate, an assembly process is carried out with a liquid crystal layer sandwiched between the color filter substrate and the TFT substrate, and further a polarizer and the like are attached, whereby the liquid crystal display device is completed.

As shown in FIGS. 8B and 8C, the above structure has the gate electrode 125b formed in a region for forming the auxiliary capacitance. Therefore no impurity can be injected into the semiconductor film 123a under the gate electrode 125b, and the semiconductor film 123a under the gate electrode 125b cannot be metalized. In order to solve this problem within the scope of the conventional method, it is necessary to add processes of forming a mask, performing injection, and then removing the mask in an initial stage, or form an independent auxiliary capacitance line as shown in FIG. 1.

SUMMARY OF THE INVENTION

The present invention has been made in view of the above problems, and it is an object of the present invention to provide a display device with a high aperture ratio and a large auxiliary capacitance and a method of manufacturing the display device without increasing manufacturing processes.

According to an aspect of the present invention, there is provided a display device including: a display element; a first scanning line; a second scanning line; a data signal line; a switching element having a first terminal and a second terminal of a first conduction type, the first terminal being connected to the data signal line, for being held in a conducting state or a non-conducting state according to a voltage applied to the first scanning line; and a storage capacitance having a first electrode and a second electrode that shares the second scanning line; wherein the second terminal of the switching element is connected to the display element and connected to the first electrode of the storage capacitance including a semiconductor film of a second conduction type different from the second terminal.

While the switching element is held in the conducting state, the storage capacitance is charged from the data signal line via the switching element, and while the switching element is held in the non-conducting state, the storage capacitance applies a voltage to the display element.

The second terminal of the switching element and the first electrode of the storage capacitance are connected to each other by a conductive material.

Specifically, the second terminal of the switching element and the first electrode of the storage capacitance are connected to each other by a conductive material deposited in a contact hole reaching the second terminal of the switching element and a contact hole reaching the first electrode of the storage capacitance.

Alternatively, the second terminal of the switching element and the first electrode of the storage capacitance are connected to each other by a conductive material deposited in a contact hole reaching the second terminal of the switching element and the first electrode of the storage capacitance.

Preferably, the conductive material for connecting the second terminal of the switching element and the first electrode of the storage capacitance to each other is identical with a conductive material used for the data signal line.

Further, preferably, a part or a whole of the storage capacitance is formed between the data signal line and the second scanning line in a region where the data signal line and the second scanning line overlap each other.

According to a second aspect of the present invention, there is provided a display device including: a plurality of first scanning lines and second scanning lines; a plurality of data signal lines; a plurality of pixels arranged in a form of a matrix; and a driving circuit for driving the plurality of pixels; wherein the driving circuit for driving each of the pixels includes: a switching element having a first terminal and a second terminal of a first conduction type, the first terminal being connected to the data signal line, for being held in a conducting state or a non-conducting state according to a voltage applied to the first scanning line; and a storage capacitance having a first electrode and a second electrode that shares the second scanning line; and the second terminal of the switching element is connected to a display element and connected to the first electrode of the storage capacitance including a semiconductor film of a second conduction type different from the second terminal.

Preferably, the switching element is a thin film transistor having polycrystalline silicon as a semiconductor layer.

According to a third aspect of the present invention, there is provided a method of manufacturing a display device, the method including the steps of: forming a conductive first scanning line and a conductive second scanning line arranged in parallel with each other, a first insulating film covering the first scanning line and the second scanning line, and a semiconductor film covering the first insulating film; forming a first protective mask and a second protective mask for protecting a first channel region and a second channel region, respectively, of the semiconductor film, the first channel region and the second channel region being opposed to the first scanning line and the second scanning line, respectively; and injecting an impurity of a first conduction type and an impurity of a second conduction type into a switching element region for forming a switching element including the first scanning line and a storage capacitance region for forming a storage capacitance including the second scanning line, respectively, in the semiconductor film, in a state in which the first protective mask and the second protective mask are formed.

According to the present invention, there may be provided a method of manufacturing a display device, the method including the steps of: forming a second insulating film so as to cover the semiconductor film having the switching element region and the storage capacitance region injected with the impurity of the first conduction type and the impurity of the second conduction type, respectively, and the first protective mask and the second protective mask; forming, in the second insulating film, a first contact hole and a third contact hole reaching semiconductor regions of the first conduction type on both sides of the first scanning line; forming, in the second insulating film, a second contact hole reaching a semiconductor region of the second conduction type on one side of the second scanning line; connecting the semiconductor region of the first conduction type on one side of the first scanning line with the semiconductor region of the second conduction type on one side of the second scanning line by depositing a conductive material in the first contact hole and the second contact hole; and forming a data signal line by depositing a conductive material in the third contact hole.

Preferably, the first contact hole is a same contact hole as the second contact hole.

Further, preferably, the conductive material deposited in the first contact hole and the second contact hole is a same material as the conductive material deposited in the third contact hole.

Further, according to a fourth aspect of the present invention, there is provided a method of manufacturing a display device, the method including the steps of: forming a semiconductor film, an insulating film covering the semiconductor film, and a conductive first scanning line and a conductive second scanning line arranged in parallel with each other on the insulating film; and injecting, from a side of the first scanning line and the second scanning line, an impurity of a first conduction type and an impurity of a second conduction type into a switching element region for forming a switching element including the first scanning line and a storage capacitance region for forming a storage capacitance including the second scanning line, respectively, in the semiconductor film.

According to the present invention described above, in the semiconductor film, the conduction type of a source and drain region of a transistor (the conduction type of a channel between the source and drain, so to speak) is opposite to the conduction type of a semiconductor film region for forming an auxiliary capacitance. When the conduction type of the source and drain region of the transistor and the channel is an N-type, for example, the semiconductor film region for forming the auxiliary capacitance is made to be of a P-type. Thus, by applying a scanning line voltage (zero or negative) that turns off the N-channel transistor to the auxiliary capacitance of a P-type MOS structure, a large capacitance is obtained. Also, when the conduction type of the source and drain region of the transistor and the channel is the P-type, and when the semiconductor film region for forming the auxiliary capacitance is made to be of the N-type, the same effects are obtained.

In addition, at the time of injection of impurities to form the above structure, it suffices only to inject different types of impurities, and therefore manufacturing processes are not increased.

Further, since the above structure provides a sufficient capacitance, at the time of injection of an impurity into the region of the semiconductor film for forming the auxiliary capacitance, a mask for protecting a channel forming region of the semiconductor film which region is opposed to the scanning line does not need to be removed by etching. Thus defect causing factors are reduced.

According to the present invention, a conventionally impossible structure of a switching transistor and an auxiliary capacitance is made possible, which increases the auxiliary capacitance and improves an aperture ratio.

In manufacturing the display device according to the present invention, an effective auxiliary capacitance can be formed without an increase in the number of processes or with a small number of processes.

In addition, since the number of times that the surface of the semiconductor layer is exposed to wet etching and dry etching is reduced, it is possible to reduce a rate of occurrence of defects such as a leakage current between the semiconductor layer and the gate electrode for the auxiliary capacitance and the like, thereby improving yield.

The present invention reduces a non-transparent region, and can thereby increase the aperture ratio greatly. It is accordingly possible to reduce backlight brightness and thus reduce power consumption.

BRIEF DESCRIPTION OF THE DRAWINGS

FIGS. 9A and 9B are sectional views, continuing from FIGS. 8A, 8B, and 8C, showing assistance in explaining the method of manufacturing the conventional display device having the top gate structure;

FIG. 11 is a sectional view of a structure of the display device according to the first embodiment of the present invention;

FIG. 15 is a diagram showing a driving circuit in the display device according to the first embodiment of the present invention;

FIG. 19 is a sectional view of a configuration of a display device according to a fourth embodiment of the present invention.

DETAILED DESCRIPTION OF PREFERRED EMBODIMENTS

Preferred embodiments of a display device and a method of manufacturing the same according to the present invention will hereinafter be described with reference to the accompanying drawings by taking a liquid crystal display device as an example.

First Embodiment

Figure 1:
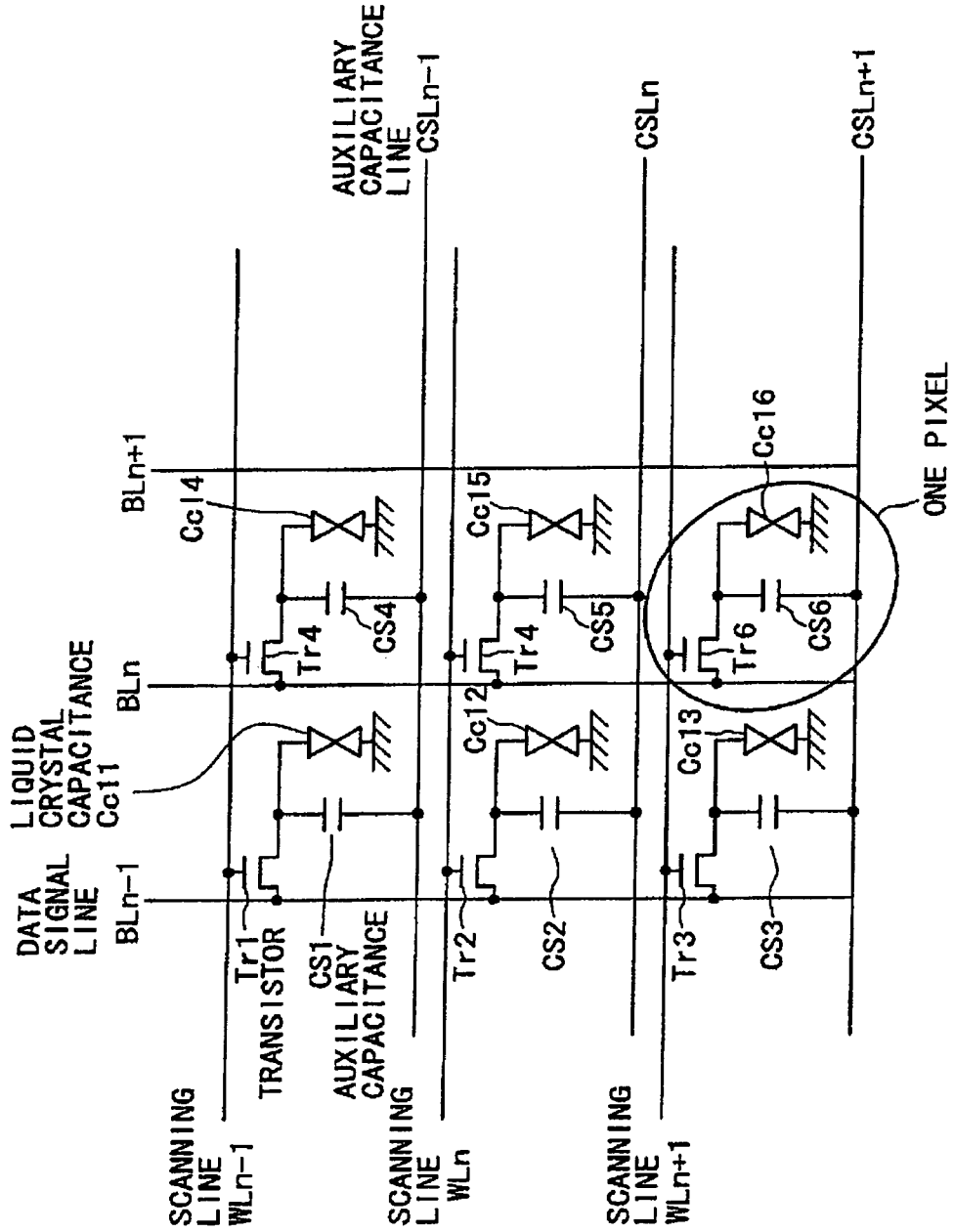
FIG. 1 shows an equivalent circuit of an example of a conventional display device.
Figure 2:
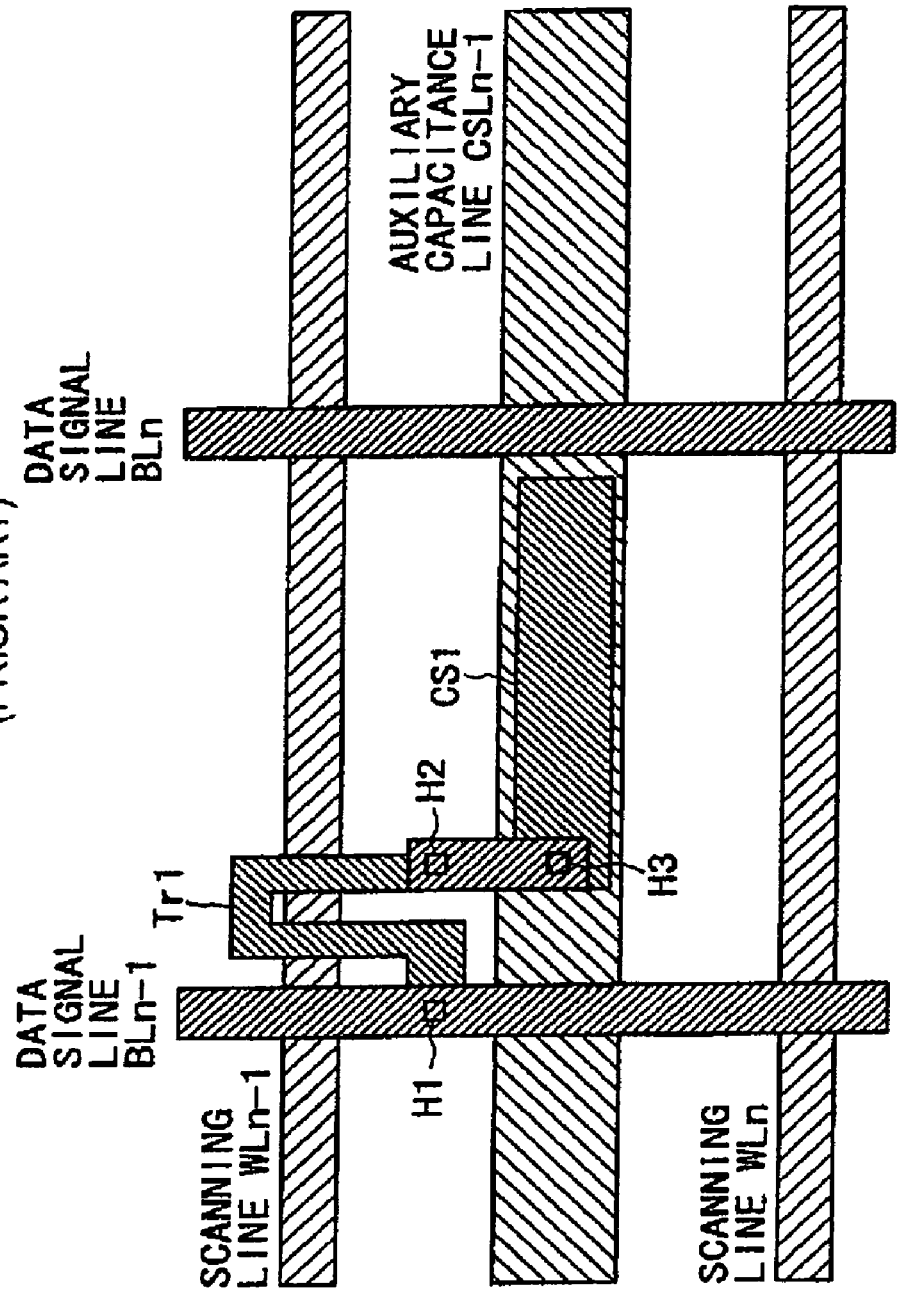
FIG. 2 is a plan view of a configuration of the conventional display device shown in FIG. 1.
Figure 3A:
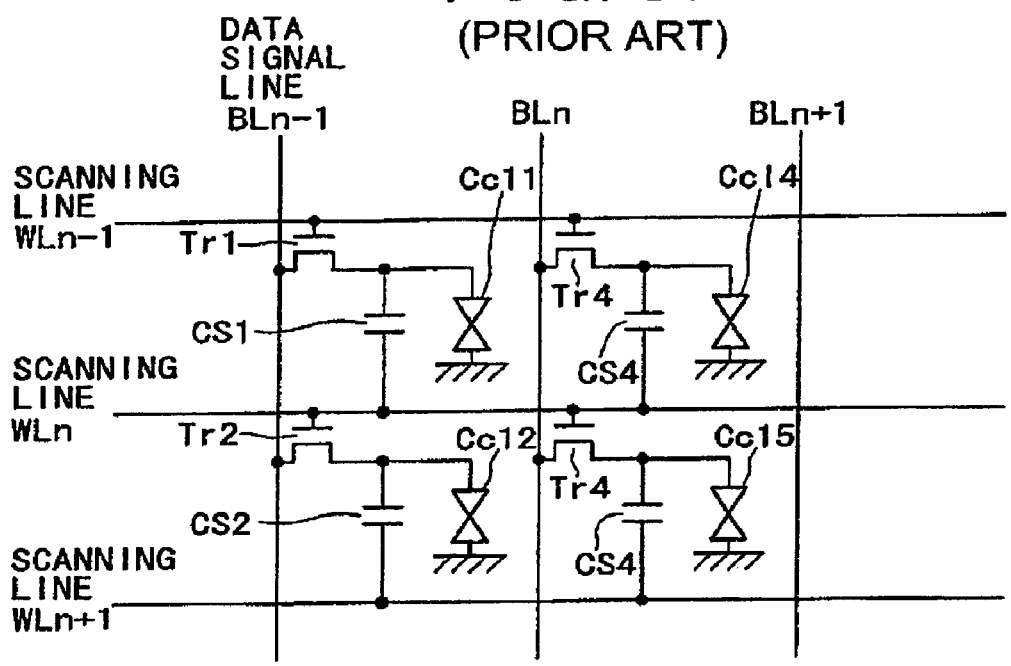
FIG. 3A shows an equivalent circuit of another example of a conventional display device having a bottom gate structure.
Figure 3B:
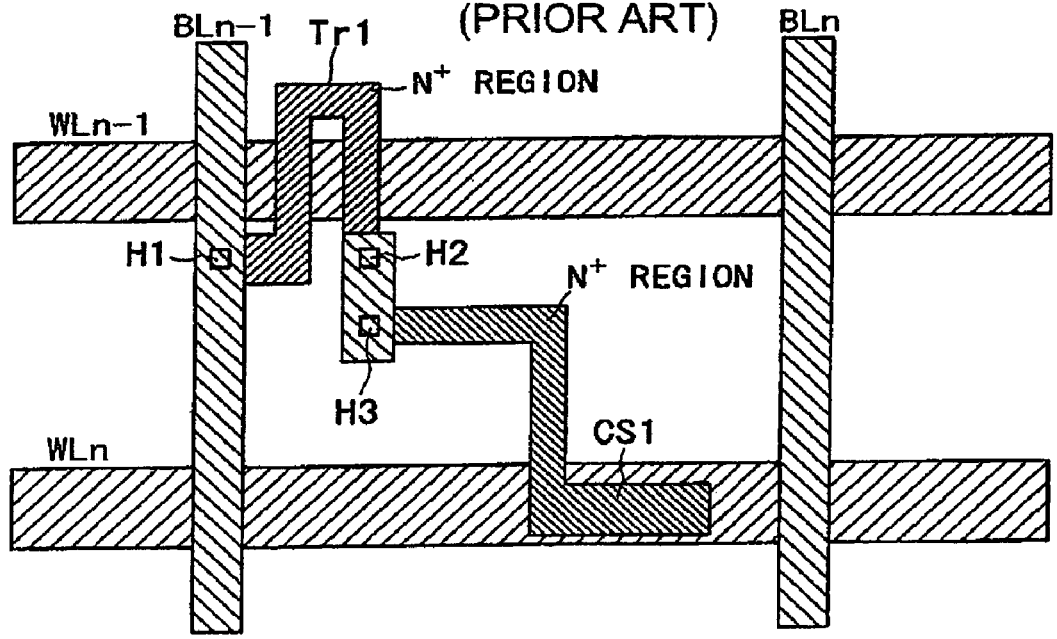
FIG. 3B is a plan view of a configuration of the display device.
Figure 10A:
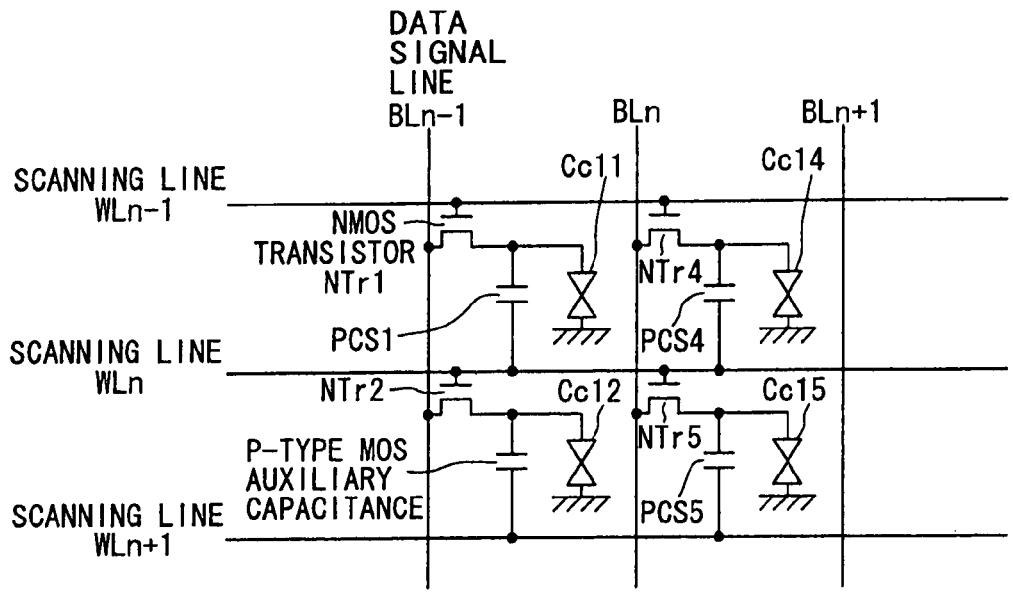
FIG. 10A shows an equivalent circuit of a display device according to a first embodiment of the present invention.
Figure 10B:
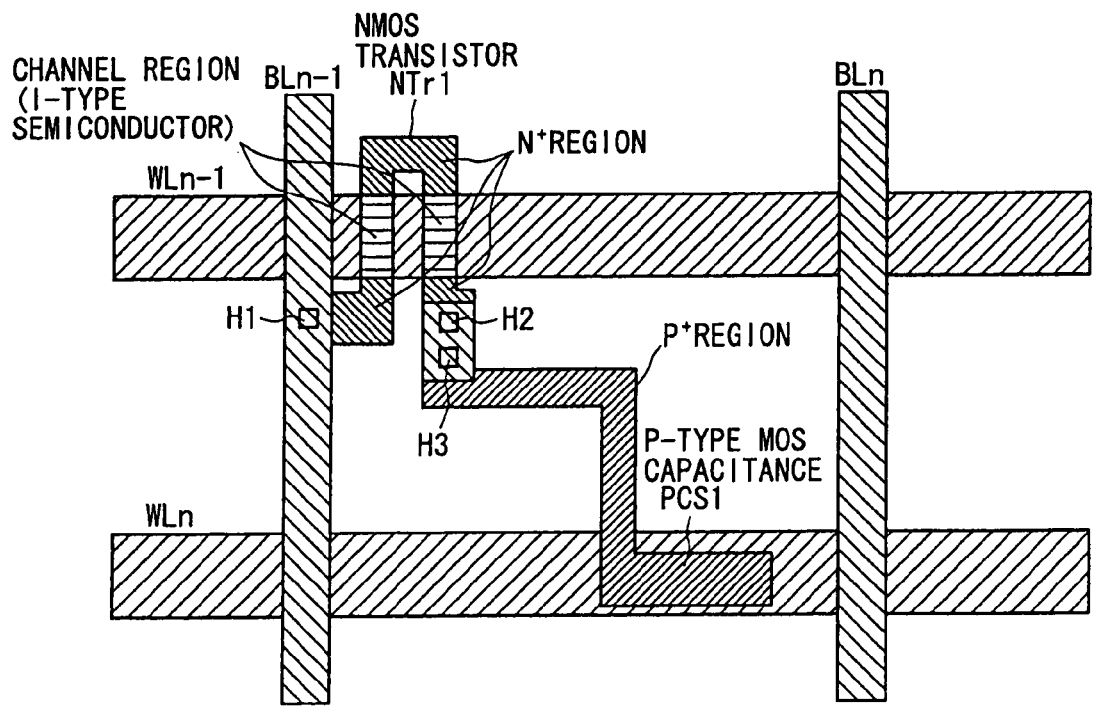
FIG. 10B is a plan view of a configuration of the display device.

FIGS. 10A and 10B are diagrams showing an equivalent circuit and a configuration of a liquid crystal display device according to a first embodiment. The circuit arrangement diagram of FIG. 10A is similar to that of the conventional example shown in FIG. 3A. However, in FIG. 10A, a conduction type of semiconductor film possessed by auxiliary capacitances PCS1, PCS2, PCS4, and PCS5 is different from a conduction type of transistors NTr1, NTr2, NTr4, and NTr5. In this example, the transistors NTr1, NTr2, NTr4, and NTr5 are formed by an N-channel TFT, and the auxiliary MOS capacitances are formed by a P-type MOS structure. That is, the auxiliary MOS capacitances are formed by a scanning line (metal), a gate insulating film, and a P-type semiconductor film.

The conduction types may be changed to form the transistors by a P-channel type TFT and the auxiliary capacitances by an N-type MOS structure.

FIG. 10A shows an equivalent circuit of 2×2 pixels. A plurality of scanning lines WLn−1, WLn, and WLn+1 in FIG. 10A are arranged in parallel with each other, and each connected to gate electrodes of the transistors NTr1 and NTr4 or the transistors NTr2 and NTr5 formed by N-channel TFTs, for example. The scanning lines WLn−1, WLn, and WLn+1 effect ON/OFF control of each of the transistors and thereby select pixels to be operated.

The auxiliary capacitances PCS1, PCS2, PCS4, and PCS5 of the P-type MOS structure each formed by a scanning line, a gate insulating film, and a P-type semiconductor film are each directly connected to the scanning line WLn or WLn+1.

Data signal lines BLn−1, BLn, and BLn+1 arranged in parallel with each other for applying a voltage corresponding to a video signal to each pixel are connected to one impurity region, for example a source region of the transistors NTr1 and NTr2 or the transistors NTr4 and NTr5. The data signal lines BLn−1, BLn, and BLn+1 apply voltage to electrodes of liquid crystal elements in pixels selected by the scanning line WLn−1, WLn, or WLn+1 while charging the auxiliary capacitances PCS of the P-type MOS structure, whereby light entering the liquid crystals is modulated to display an image.

FIG. 10B is a plan view of the configuration of scanning lines, data signal lines, and one pixel formed on a transparent substrate. In FIG. 10B, the P-type MOS auxiliary capacitance PCS1 shown in FIG. 10A is formed on the scanning line WLn with an intermediate gate insulating film not shown in the figure.

One impurity region, for example a source region of the N-channel type transistor NTr1 is connected to the data signal line BLn−1 via a conductive material deposited in a contact hole H1. Another impurity region, for example a drain region of the N-channel type transistor NTr1 is connected to the semiconductor film of the auxiliary capacitance PCS1 and an ITO electrode of an upper layer not shown in the figure via conductive materials deposited in contact holes H2 and H3.

FIG. 11 is a schematic sectional view of the pixel structure shown in FIG. 10B. FIG. 10B is a sectional view taken along a semiconductor layer pattern from the data signal line to the auxiliary capacitance. Because of limited space, however, the TFT transistor portion is shown having a single gate structure rather than a double gate structure in which transistors are arranged in series.

In FIG. 11, scanning lines 1a and 1b (WLn−1 and WLn) are formed on the transparent substrate not shown in the figure, a gate insulating film 2 is formed so as to cover the scanning lines 1a and 1b, and semiconductor films 3, 4, 5, and 6 are formed on the gate insulating film 2, whereby the TFT transistor and the auxiliary capacitance are formed.

In the semiconductor film, reference numeral 3 denotes an $N^+$ semiconductor region having a high concentration of phosphorus (P), for example, injected therein, and reference numeral 4 denotes a $P^+$ semiconductor region having a high concentration of boron (B), for example, injected therein. A center of the semiconductor film 5 is a so-called i-type semiconductor film without an impurity injected therein, and both sides of the semiconductor film 5 are an LDD region having a low concentration of phosphorus (P), for example, injected therein. The semiconductor film 5 forms a channel region of the TFT transistor. In the example of FIG. 11, this semiconductor film forms an N-channel region. Reference numeral 6 also denotes a so-called i-type semiconductor film without an impurity injected therein.

References 7a and 7b denote stopper films formed so as to prevent impurity injection into the i-type semiconductor films 5 and 6 under the stopper films. Reference numeral 8 denotes an interlayer insulating layer.

Contact holes are formed in the interlayer insulating layer 8 on the $N^+$ semiconductor region 3 and the $P^+$ semiconductor region 4. A conductive material in the contact holes forms a connecting electrode 10 for connecting the $N^+$ semiconductor region 3 and the $P^+$ semiconductor region 4 to each other. The conductive material also forms a data signal line 9.

The gate electrode 1a, the gate insulating film 2, and the semiconductor films 4 and 5 form the N-channel type TFT transistor. On the other hand, the gate electrode 1b, the gate insulating film 2, and the semiconductor films 4 and 6 form a P-channel type transistor. A capacitance of the P-channel type transistor is used as the auxiliary capacitance.

As to conduction of the semiconductor region 3 and the $P^+$ semiconductor region 4, when the $N^+$ semiconductor region 3 and the $P^+$ semiconductor region 4 are directly connected to each other, a PN junction occurs between the $N^+$ semiconductor region 3 and the $P^+$ semiconductor region 4, thus causing a potential loss. It is accordingly desirable to make a connection from the $N^+$ semiconductor region 3 to the $P^+$ semiconductor region 4 via a metal. In the first embodiment, the metal is deposited in the contact hole for connection to the $N^+$ type semiconductor 3 and the contact hole for connection to the $P^+$ type semiconductor 4, whereby the connecting electrode 10 is formed to connect the $N^+$ semiconductor region 3 and the $P^+$ semiconductor region 4 to each other.

It is desirable that a material for the connecting electrode 10 be a material used for the data signal line 9. The use of the same metal as that of the data signal line 9 eliminates the need for a special process for the connection, and thus enables manufacturing at a lower cost.

Figure 7A:
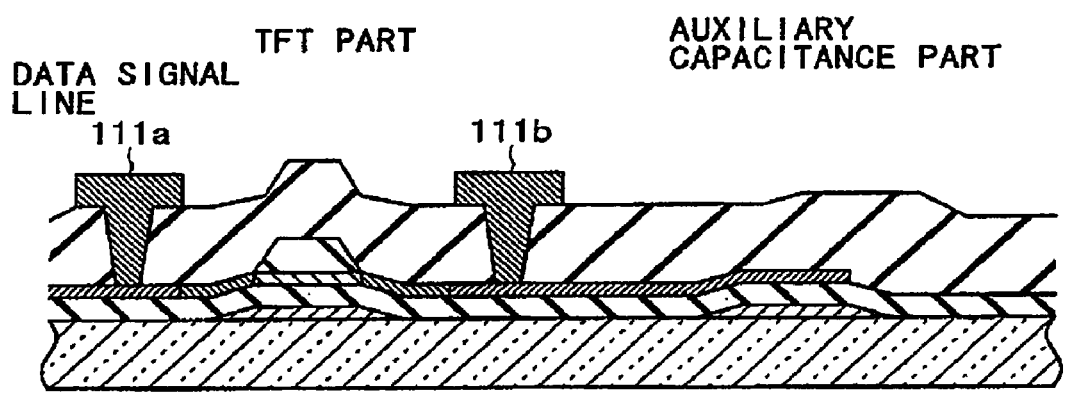
FIGS. 7A and 7B are sectional views, continuing from FIGS. 6A, 6B, and 6C, showing assistance in explaining the method of manufacturing the conventional display device shown in FIGS. 3A and 3B.
Figure 7B:
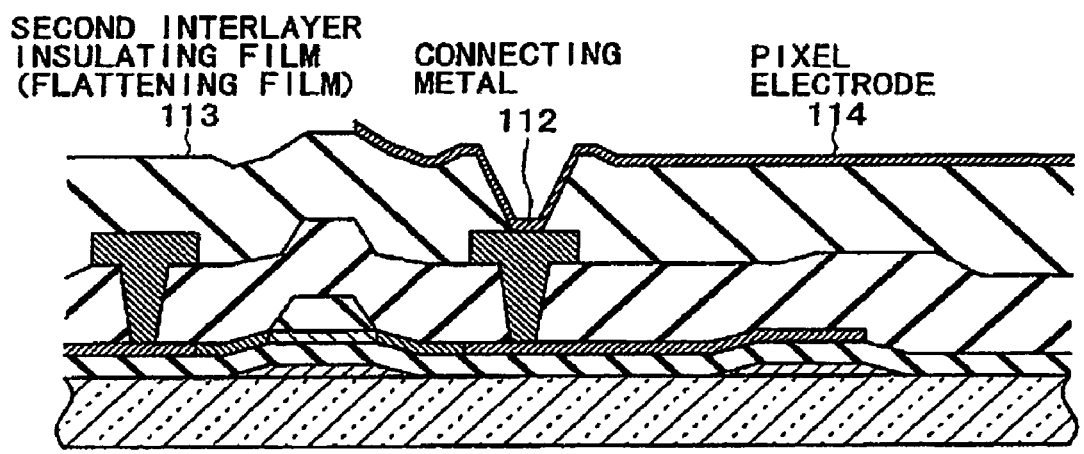

As another metal for the connection, a pixel electrode (FIG. 7B and FIG. 9B) may be used.

However, the contact holes are not necessarily required; a metallic layer may be formed directly on the $N^+$ type semiconductor 3 and the $P^+$ type semiconductor 4.

Figure 12A:
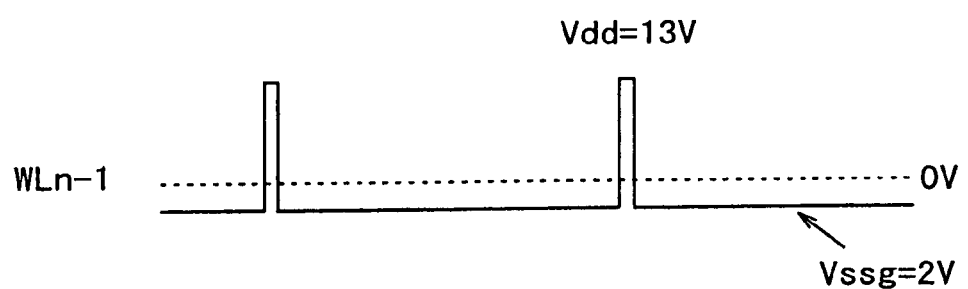
FIGS. 12A, 12B, and 12C are timing charts of scanning line signals and pixel potential in the display device according to the first embodiment of the present invention.
Figure 12B:
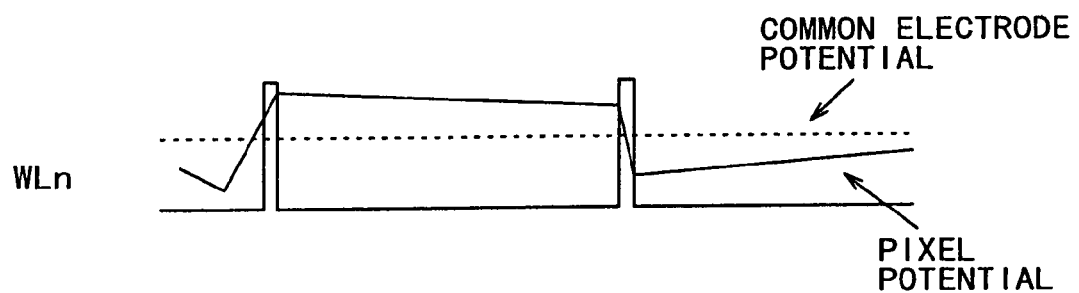
Figure 12C:

FIGS. 12A, 12B, and 12C are timing charts of scanning line voltage applied to the scanning lines WLn−1, WLn, and WLn+1 in the liquid crystal display device according to the first embodiment as shown by FIG. 10A. Vdd and Vssg in FIG. 12A denote voltages for bringing the TFT transistor of each pixel into an ON state and an OFF state, respectively. As an example, Vdd=13 V and Vssg=−2 V.

In FIG. 12B, a broken line indicates a potential of a common electrode, and an irregular line indicates timing of change in a pixel potential.

As shown in FIGS. 12A, 12B, and 12C, in displaying an image, the scanning lines WLn−1, WLn, WLn+1, . . . sequentially output a high-level voltage signal (Vdd) to the transistors NTr1, NTr4, NTr2, NTr5 of the pixels, and thereby turn on the transistors to operate the pixels.

For display of one screen, each pixel is operated only once. Therefore a period when the scanning line voltage is Vdd is far shorter than a period when the scanning line voltage is Vssg, and each transistor is maintained in an OFF state during most of a period of display of one screen. That is, the voltage of −2 V is applied to the scanning lines WLn−1, WLn, and WLn+1 during most of the display period.

Thus, the voltage of −2 V is applied to the metallic electrode (scanning line) of the P-type MOS auxiliary capacitance PCS1, for example, shown in FIGS. 10A and 10B and FIG. 11 during most of the period.

As for another electrode including the P-type semiconductor film of the auxiliary capacitance PCS1, on the other hand, when the transistor NTr1 is in an ON state, a high-level signal from the data signal line BLn−1 applies a voltage to electrodes on both sides of the liquid crystal while charging the auxiliary capacitance PCS1 via the source and drain of the transistor NTr1. Since the auxiliary capacitance PCS1 is charged, a potential of the semiconductor film electrode of the auxiliary capacitance PCS1 is higher than Vssg. When the transistor NTr1 is in an OFF state, the source and drain of the transistor NTr1 are disconnected from each other, and therefore a signal from the data signal line BLn−1 does not supply a voltage to the liquid crystal and the auxiliary capacitance PCS1. The auxiliary capacitance PCS1 supplies a voltage to the electrodes on both sides of the liquid crystal.

As shown in the graph of the pixel potential of FIG. 12B, while the potential of the semiconductor film of the auxiliary capacitance PCS1 (the same as the pixel potential) is gradually lowered and raised, the potential is higher than Vssg at all times. Then, a voltage Vg from the metal side (scanning line side) to the semiconductor film of the auxiliary capacitance PCS1 is negative at all times.

Figure 4:
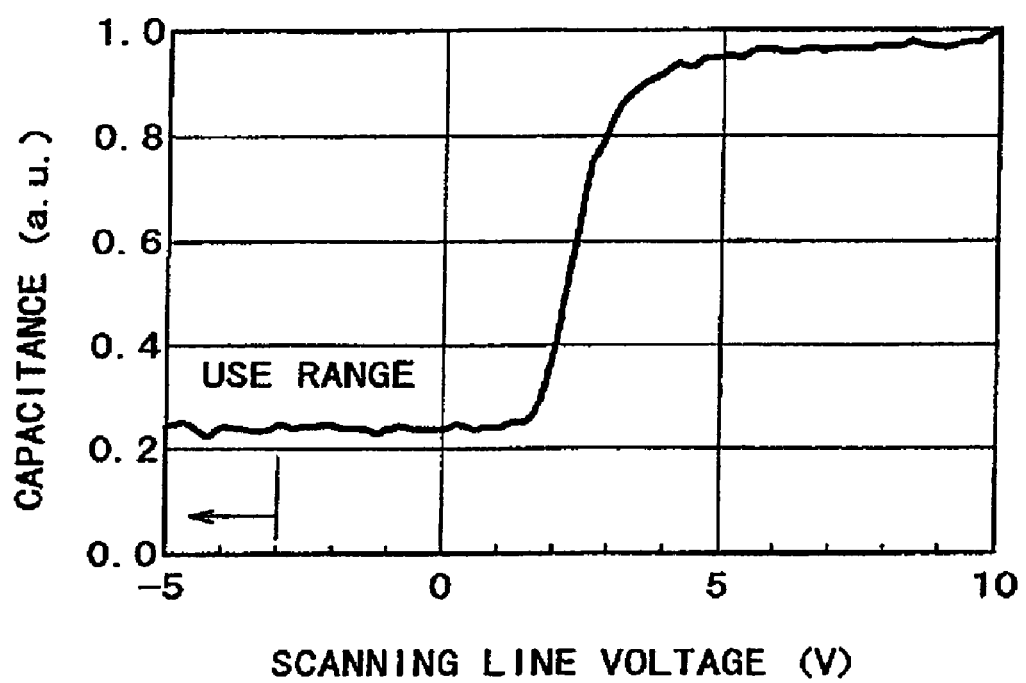
FIG. 4 is a graph showing a result of measurement of voltage-capacitance characteristics of an auxiliary capacitance in the conventional display device shown in FIGS. 3A and 3B.

As already described with reference to the graph of FIG. 4, when such a voltage Vg is applied to an N-type MOS capacitance comprising a scanning line (metal), a gate insulating film, and an N-type semiconductor film, since majority carriers of the N-type semiconductor are electrons, the negative scanning line voltage (or the voltage Vg) causes the majority carriers to be repelled from a surface of the semiconductor film and a depletion layer (and/or an inversion layer) to be formed, which corresponds to an increase in thickness of the insulating layer of the auxiliary capacitance. Thus, as shown in FIG. 4, a resulting capacitance is small.

Figure 13:
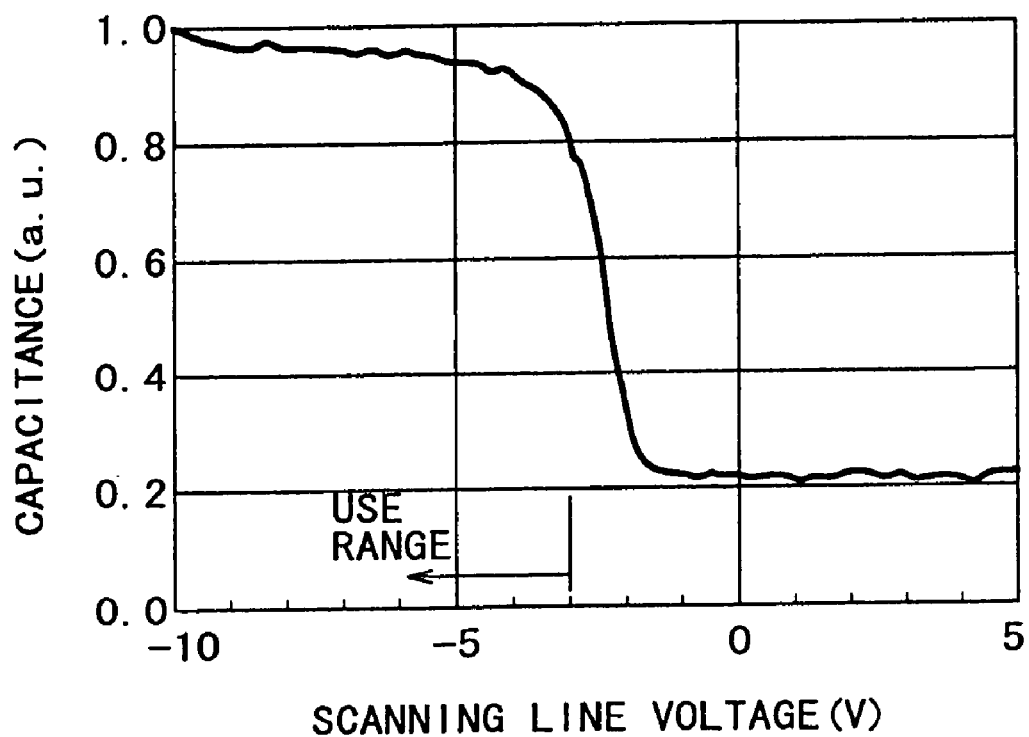
FIG. 13 is a graph showing a result of measurement of voltage-capacitance characteristics of an auxiliary capacitance in the display device according to the first embodiment of the present invention.

FIG. 13 is a graph showing capacitance-voltage characteristics of a P-type MOS structure.

In the P-type MOS capacitance comprising a scanning line (metal), a gate insulating film, and a P-type semiconductor film, since majority carriers of the P-type semiconductor are holes, the negative scanning line voltage (or the voltage Vg) does not cause a depletion layer to be formed but instead causes the majority carriers to be gathered on a surface of the P-type semiconductor film. Thereby, as shown in FIG. 13, a large capacitance is obtained.

Thus, with the first embodiment, a sufficient capacitance is formed in a use range (the period when the scanning line voltage is Vssg) in normal driving conditions.

Thus, in general, when an N-channel type pixel transistor is formed, the auxiliary capacitance needs to be formed by a P-type MOS capacitance. When a P-channel type pixel transistor is formed, it is desirable that the auxiliary capacitance be formed by an N-type MOS capacitance.

While in the first embodiment, the auxiliary capacitance is formed with the scanning line (gate line) WLn in the next stage, the auxiliary capacitance may be formed with a scanning line (gate line) WLn−2 in a preceding stage.

Conventionally, when the scanning line WLn forming the auxiliary capacitance is raised to a high level, the pixel potential is substantially shifted. With the P-type MOS capacitance as in the first embodiment, when the scanning line WLn is raised to a high level, the P-type MOS capacitance is effectively decreased, and an amount of shift is decreased, as shown in FIG. 12B. Thereby display quality is improved.

Figure 14A:
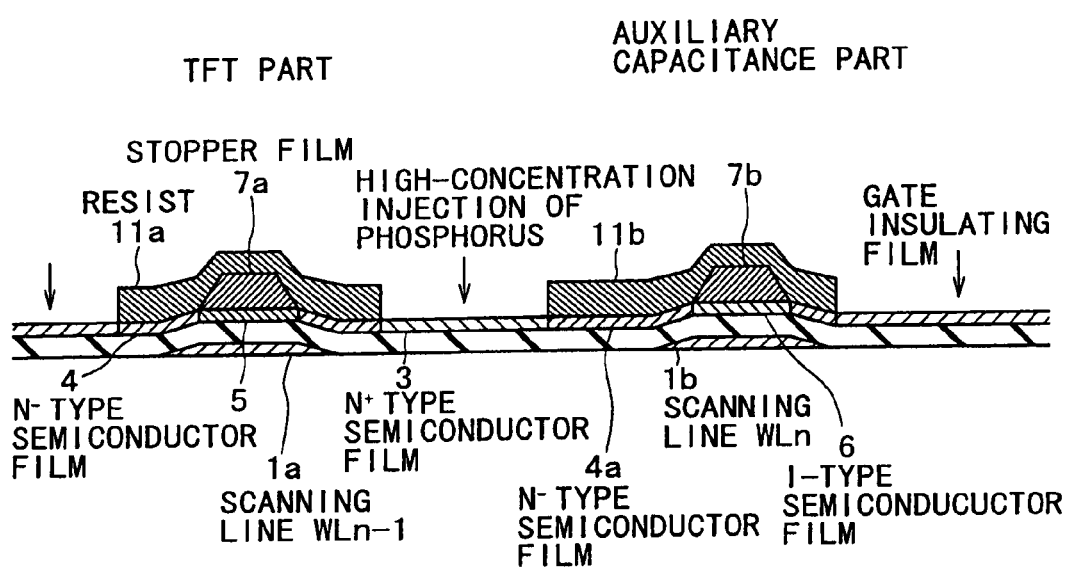
FIGS. 14A and 14B are sectional views of assistance in explaining a method of manufacturing the display device according to the first embodiment of the present invention.
Figure 14B:
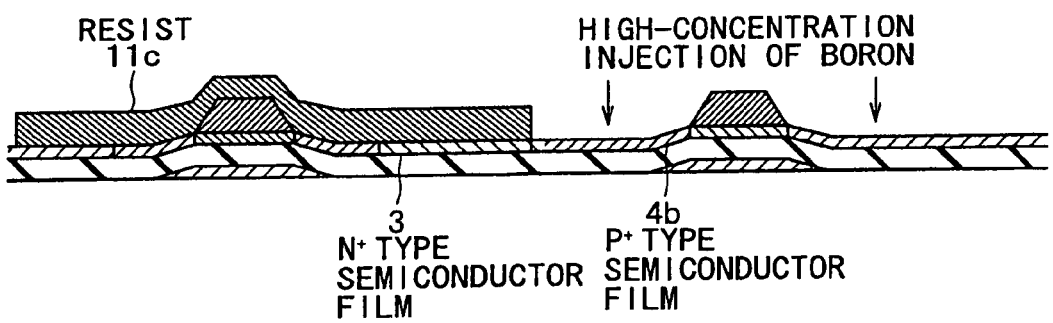

FIGS. 14A and 14B illustrate a method of manufacturing the liquid crystal display device according to the first embodiment. The manufacturing method according to the first embodiment is obtained by changing the conventional process shown in FIG. 6A in the conventional manufacturing method shown in FIGS. 5A to 5D, FIGS. 6A to 6C, and FIGS. 7A and 7B.

Figure 5A:
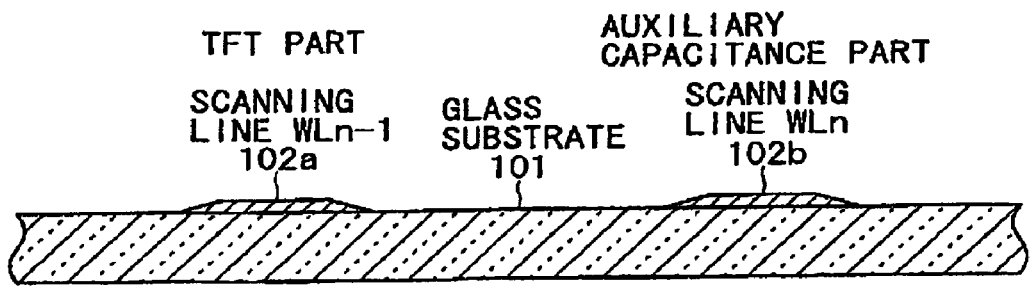
FIGS. 5A, 5B, 5C, and 5D are sectional views of assistance in explaining a method of manufacturing the conventional display device shown in FIGS. 3A and 3B.
Figure 5B:
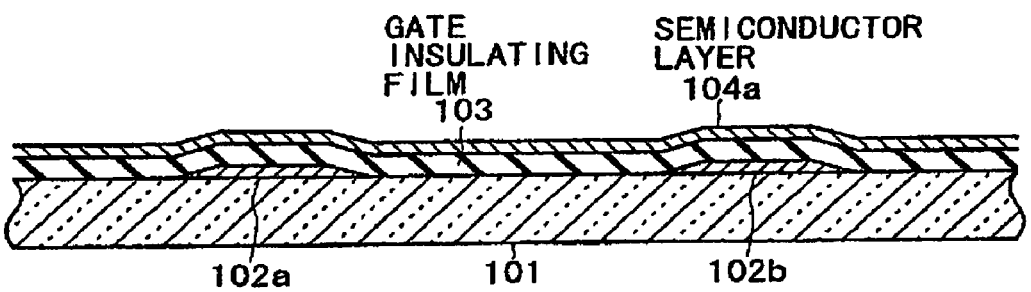
Figure 5C:
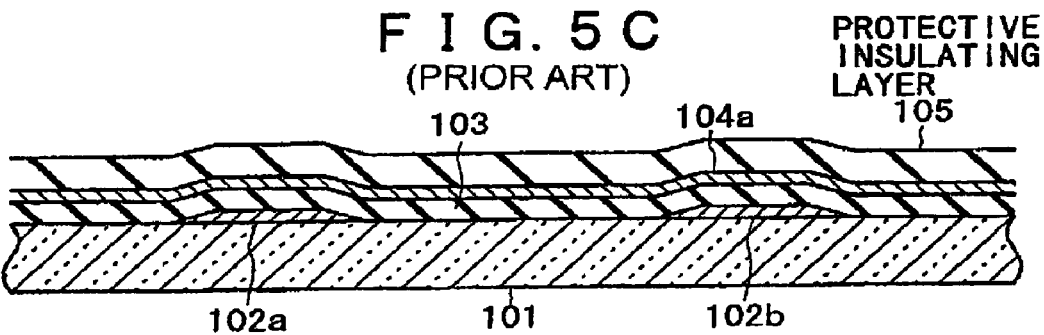
Figure 5D:
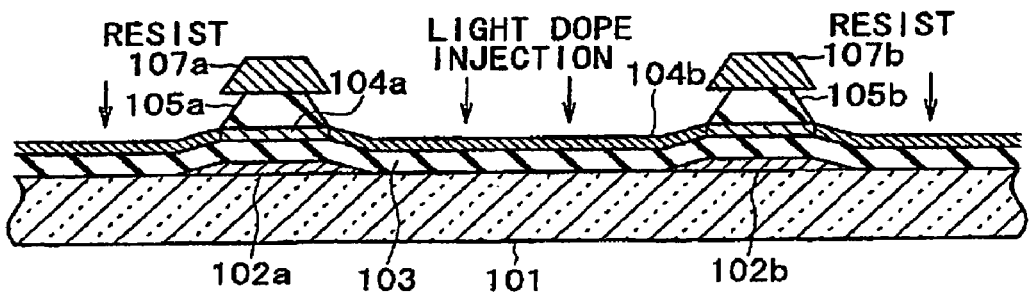
Figure 6A:
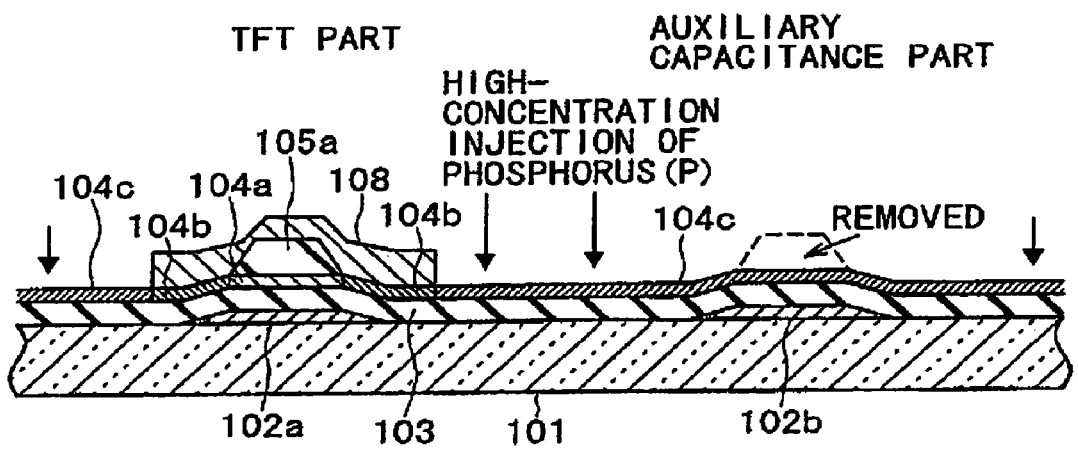
FIGS. 6A, 6B, and 6C are sectional views, continued from FIGS. 5A, 5B, 5C, and 5D, showing assistance in explaining the method of manufacturing the conventional display device shown in FIGS. 3A and 3B.
Figure 6B:
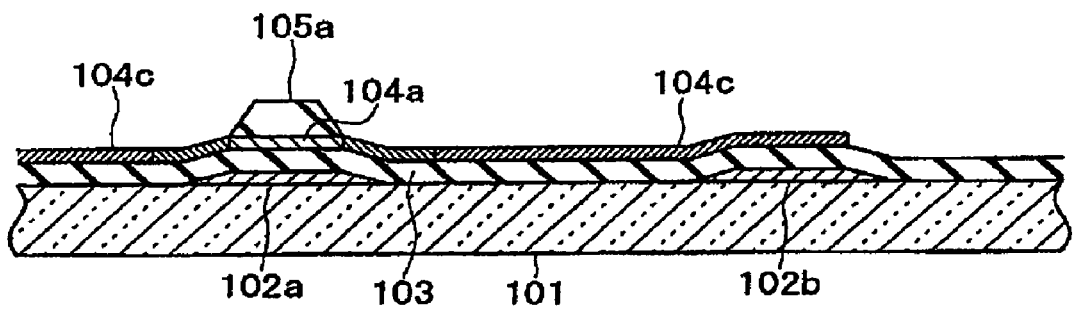
Figure 6C:
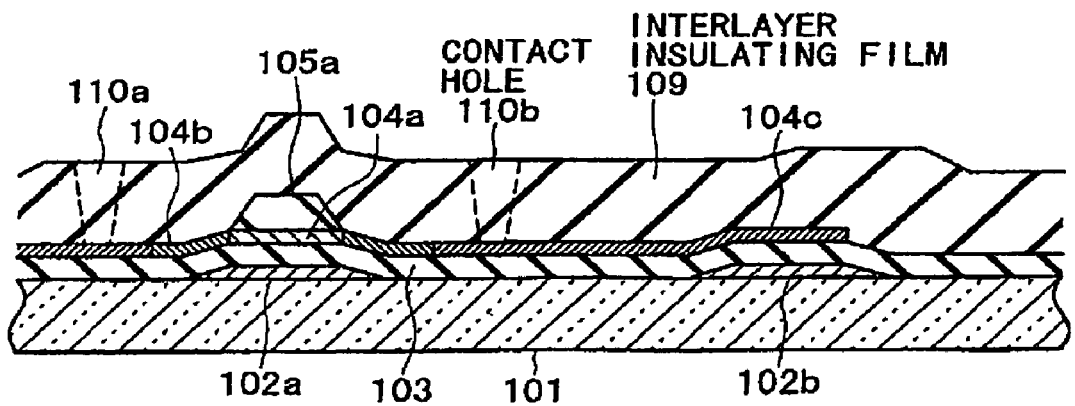

Following the process of FIG. 5D, in FIG. 14A, phosphorus is injected at a high concentration in the vicinity of the TFT transistor to thereby form the N$^+$ semiconductor region 3 and thus metalize the semiconductor layer. At this time, a resist 11b is formed so as to prevent the high-concentration injection of phosphorus in the vicinity of the auxiliary capacitance. Thus, as in the process of FIG. 5D, an N$^-$ type semiconductor region 4a is formed around the auxiliary capacitance after the high-concentration injection of phosphorus.

In addition, the conventional process of removing the protective insulating film on the auxiliary capacitance is not required.

In FIG. 14B, the resist pattern 11b in the vicinity of the auxiliary capacitance is removed, and boron is injected at a high concentration around the auxiliary capacitance to thereby form a P$^+$ type semiconductor region 4b. At this time, a resist 11c is formed so as to prevent the high-concentration injection of boron in the vicinity of the TFT transistor.

Thereafter heat treatment is performed as required to activate doped elements.

As described above, the liquid crystal display device according to the first embodiment includes an element of a first conduction type and a MOS structure of a second conduction type. The use of such elements of the two conduction types allows a CMOS type driving circuit or logical circuit to be formed in a display pixel region, a region outside of the display pixel region, or both the regions.

FIG. 15 shows an example of configuration of a display device in which each pixel is driven by such CMOS. In FIG. 15, a plurality of scanning lines arranged in parallel with each other and a plurality of data signal lines arranged in parallel with each other are driven by a scanning line driving circuit and a data signal line driving circuit, respectively, and each of pixels arranged in a form of a matrix is driven by a driving circuit formed by an N-channel TFT and a P-type MOS capacitance, for example.

A liquid crystal display device having such a circuit can be formed by a method as in the first embodiment without addition of a special process, and is therefore a most suitable configuration example. For example, it is desirable to use the first embodiment in a polysilicon transistor liquid crystal display device using a polysilicon film with a high mobility as a semiconductor, or the like.

According to the first embodiment, a sufficient auxiliary capacitance is obtained in a use range (the period when the scanning line voltage is Vssg) in normal driving conditions. In addition, since the auxiliary capacitance can be formed by the CS-on-gate structure, a high aperture ratio is obtained.

Further, with the method of manufacturing the liquid crystal device according to the first embodiment, processes in which the semiconductor layer is exposed to etching are reduced, and thereby defects and the like are decreased.

Second Embodiment

In a second embodiment, another example of configuration of the liquid crystal display device according to the present invention will be shown.

Figure 16:
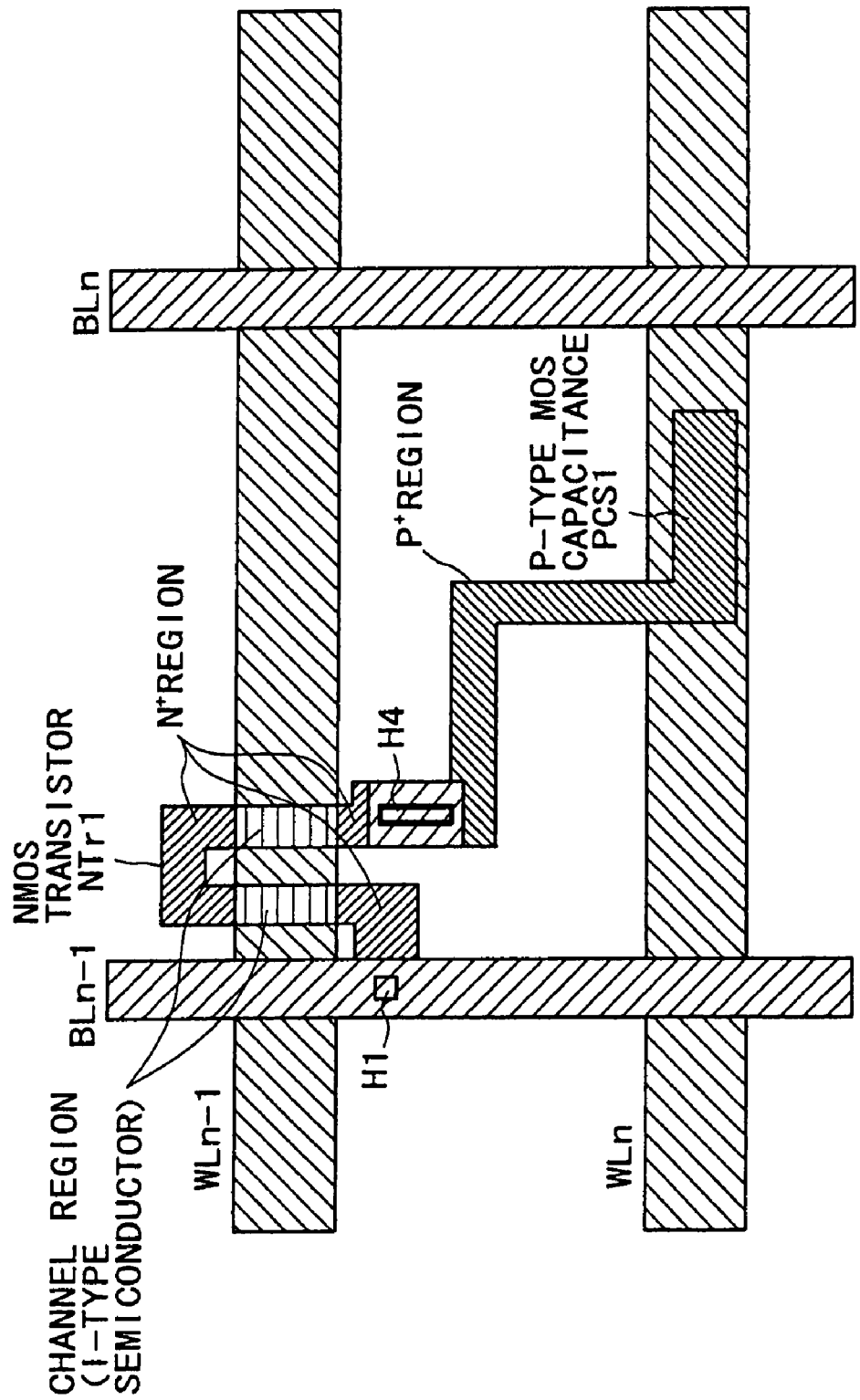
FIG. 16 is a plan view of a configuration of a display device according to a second embodiment of the present invention.
Figure 17:
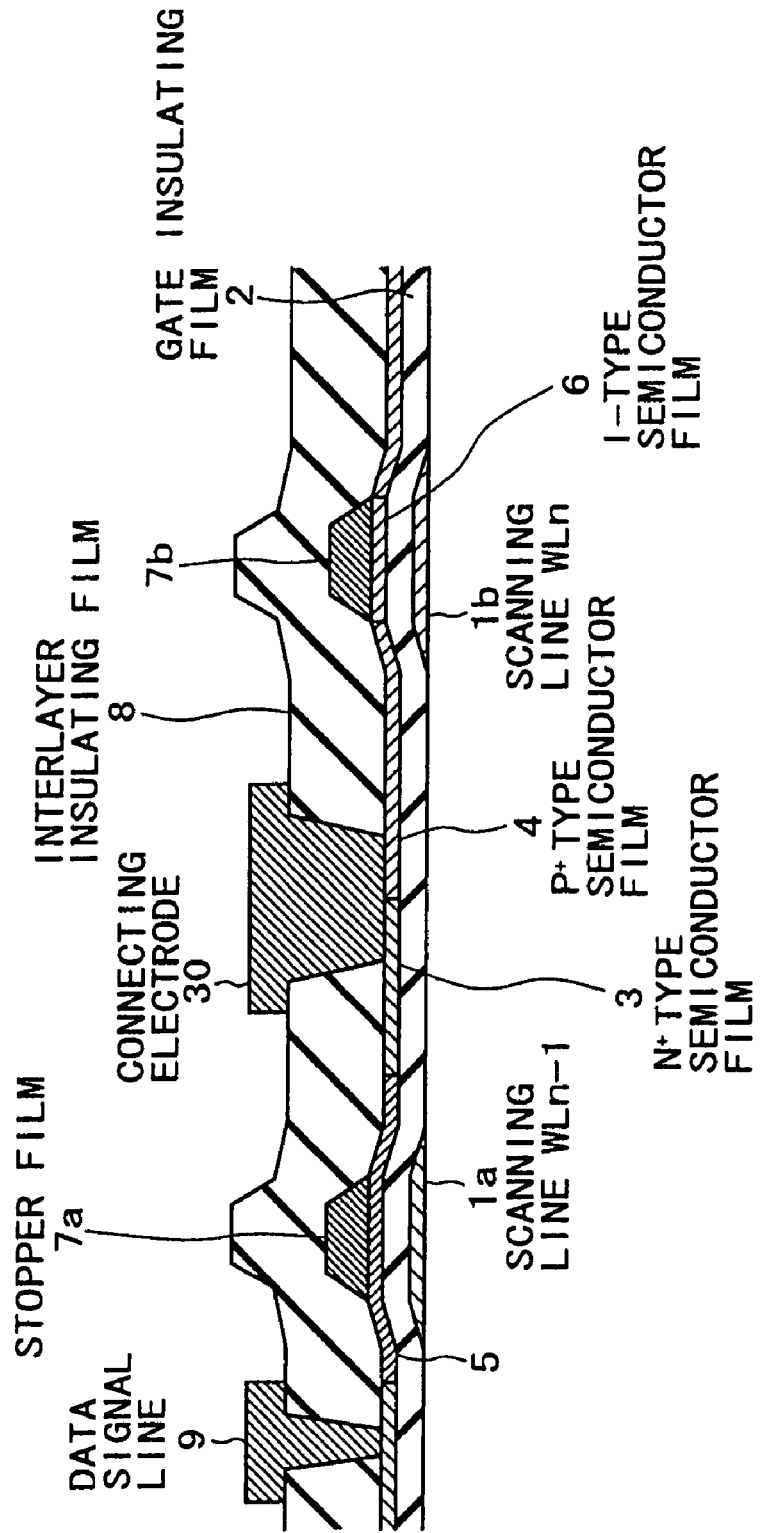
FIG. 17 is a sectional view of the configuration of the display device according to the second embodiment of the present invention.

FIG. 16 and FIG. 17 are a plan view and a schematic sectional view of the configuration of the liquid crystal display device according to the second embodiment.

The liquid crystal display device shown in FIG. 16 and FIG. 17 are basically of the same configuration as shown in FIG. 10B and FIG. 11. Therefore repeated description in the second embodiment will be omitted where appropriate, and in FIG. 16 and FIG. 17, the same references are used for the same components as in FIG. 10B and FIG. 11.

There is a difference between FIG. 16 and FIG. 10B, and between FIG. 17 and FIG. 11 in that the contact holes H2 and H3 shown in FIG. 10B for connecting the N$^+$ type semiconductor 3 and the P$^+$ type semiconductor 4 to each other are combined into one contact hole H4 in FIG. 16. The connecting electrode 10 shown in FIG. 11 formed by depositing a conductive material in the two contact holes is converted into a connecting electrode 30 in FIG. 17 formed by a conductive material deposited in the same contact hole.

It is desirable that contacts for connecting the N$^+$ type semiconductor 3 and the P$^+$ type semiconductor 4 to each other are to be the same contact hole extending over both the conduction types. By combining the contact holes into one, an area within the pixel can be utilized effectively, thus improving the aperture ratio.

Third Embodiment

In a third embodiment, another example of configuration of the liquid crystal display device according to the present invention will be shown.

Figure 18:
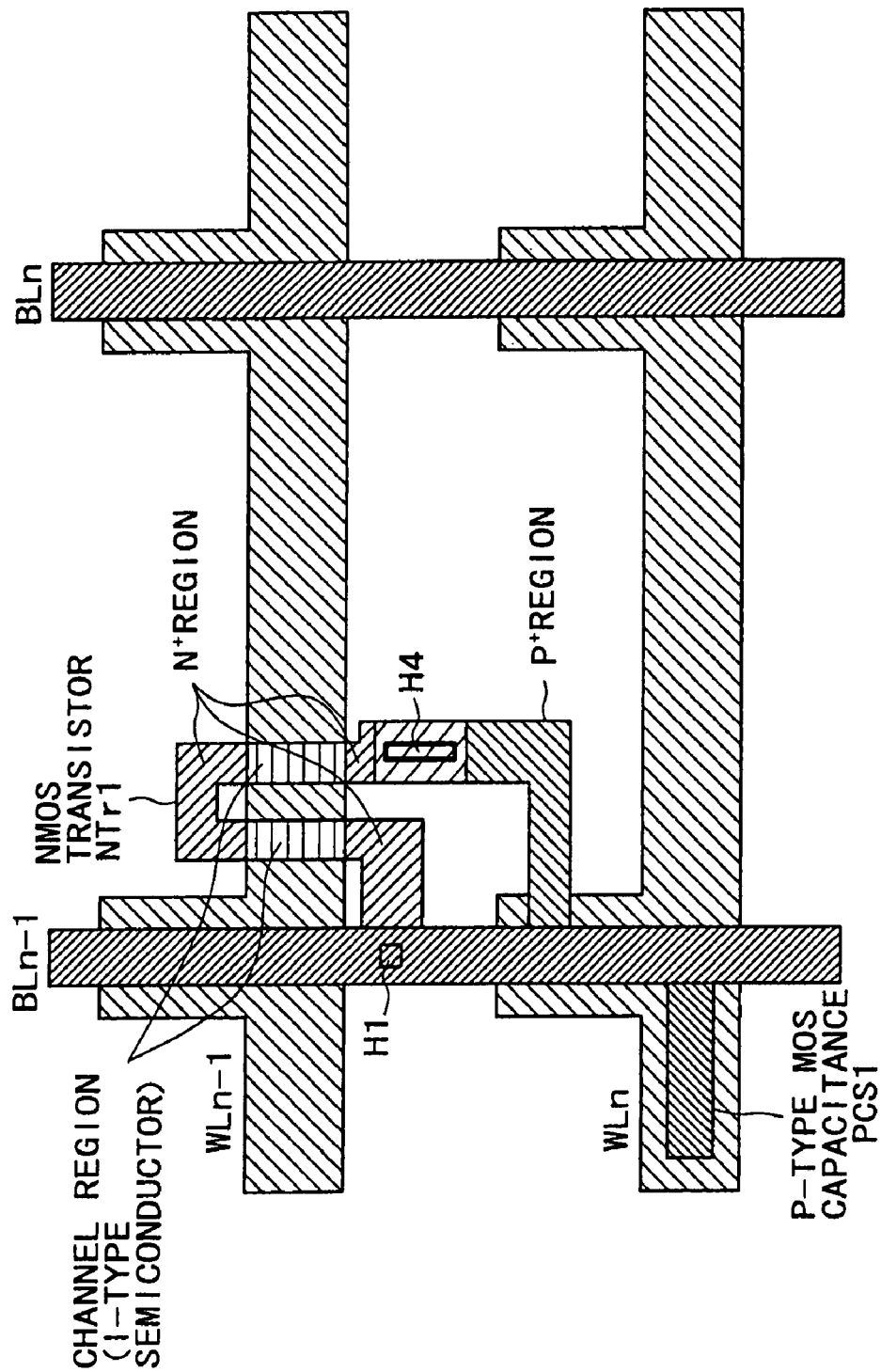
FIG. 18 is a plan view of a configuration of a display device according to a third embodiment of the present invention.

FIG. 18 is a plan view of the configuration of the liquid crystal display device according to the third embodiment.

In FIG. 18, the same references are used for the same components as in FIG. 16 and FIG. 11.

There is a difference between FIG. 18 and FIG. 11 and FIG. 16 in that a part of an auxiliary capacitance PCS1 in FIG. 18 is disposed under a data signal line BLn−1.

In this case, a region required for forming the necessary auxiliary capacitance is formed in a region where light does not pass through originally, for example a metal region (data signal line in this case). Therefore a loss in transmittance becomes smaller, and thus a high aperture ratio can be secured.

Either of a bottom gate type transistor structure and a top gate type transistor structure may be formed in this case.

When the auxiliary capacitance PCS1 is formed under the data signal line BLn−1 in the bottom gate structure shown in FIG. 18, a protective insulating film is left on the semiconductor layer, so that a coupling capacitance between the signal line and the semiconductor film is decreased. This improves display quality in terms of crosstalk and the like.

In addition, since the coupling capacitance between the signal line and the electrode under the signal line is decreased, a total signal line capacitance is decreased, and thus rounding of signal line potential is reduced, thereby improving display quality.

Fourth Embodiment

While the bottom gate type transistor structure has been described as an example, the present invention is also applicable to the top gate type transistor structure.

FIG. 19 is a sectional view of an example of configuration of a liquid crystal display device of the top gate structure according to a fourth embodiment.

In the liquid crystal display device of FIG. 19, semiconductor films 43, 44, 45, and 46 are formed on a base layer not shown in the figure formed on a transparent substrate not shown in the figure, a gate insulating film 42 is formed on the semiconductor films, and further scanning lines 41a and 41b (WLn−1 and WLn) and an interlayer insulating film 48 are formed on the gate insulating film 42. Thereby a TFT transistor and an auxiliary capacitance are formed.

Reference numeral 43 denotes an $N^+$ semiconductor region, and reference numeral 44 denotes a $P^+$ semiconductor region. A center of the semiconductor film 45 is an i-type semiconductor film, and both sides of the semiconductor film 45 are an LDD region. The semiconductor film 45 forms a channel region of the TFT transistor. In the example of FIG. 19, this semiconductor film forms an N-channel region. Reference numeral 46 also denotes an i-type semiconductor film.

Reference numeral 46 also denotes a so-called i-type semiconductor film without an impurity injected therein. Contact holes are formed in the interlayer insulating layer 48 on the $N^+$ semiconductor region 43 and the $P^+$ semiconductor region 44. A conductive material in the contact holes forms a connecting electrode 50 for connecting the $N^+$ semiconductor region 43 and the $P^+$ semiconductor region 44 to each other. The conductive material also forms a data signal line 49.

The gate electrode 41a, the gate insulating film 42, and the semiconductor films 44 and 45 form the N-channel type TFT transistor. On the other hand, the gate electrode 41b, the gate insulating film 42, and the semiconductor films 44 and 46 form a P-channel type transistor. A capacitance of the P-channel type transistor is used as the auxiliary capacitance.

The schematic sectional view of the structure shown above corresponds to the structure shown in FIG. 10B. The structure shown above may correspond to that of FIG. 16.

Also, the pixel transistor may have an N-channel or a P-channel.

Figure 20A:
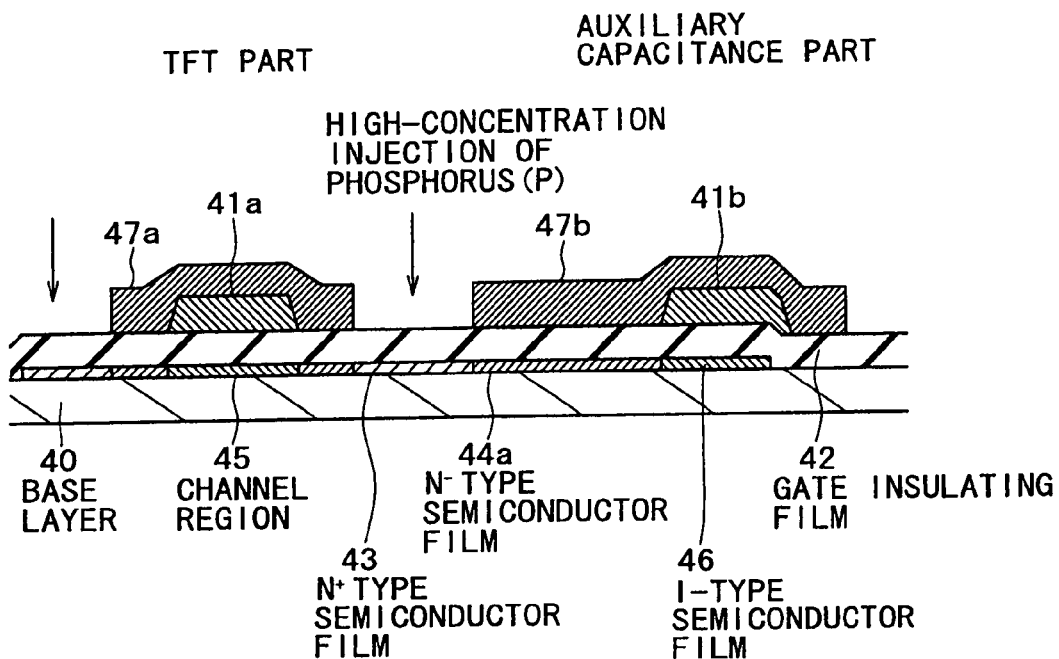
FIGS. 20A and 20B are sectional views of assistance in explaining a method of manufacturing the display device according to the fourth embodiment of the present invention.
Figure 20B:
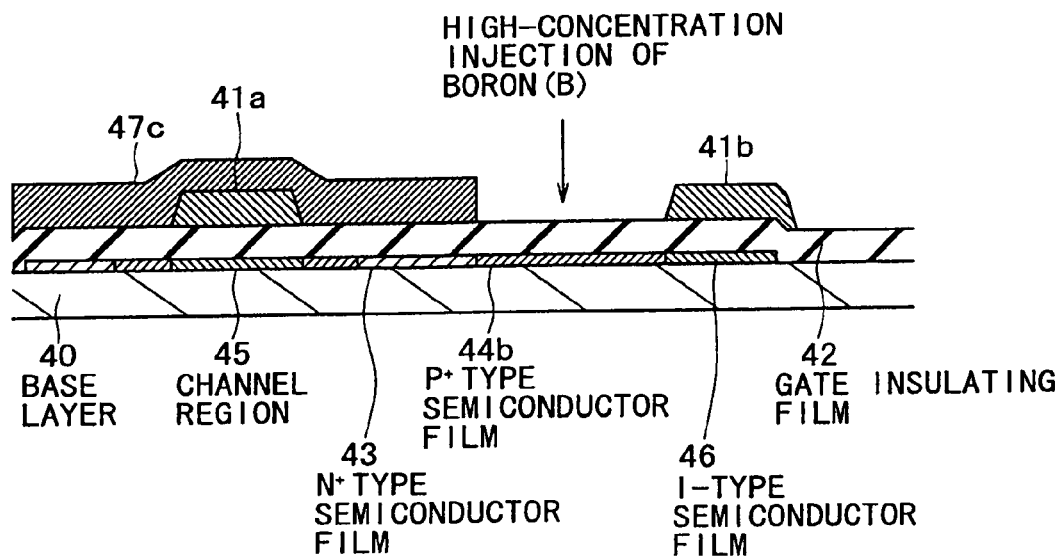

FIGS. 20A and 20B illustrate a method of manufacturing the liquid crystal display device having the top gate structure according to the fourth embodiment. The manufacturing method according to the fourth embodiment is obtained by changing the conventional process shown in FIG. 8C in the conventional manufacturing method shown in FIGS. 8A to 8C and FIGS. 9A and 9B.

Figure 8A:
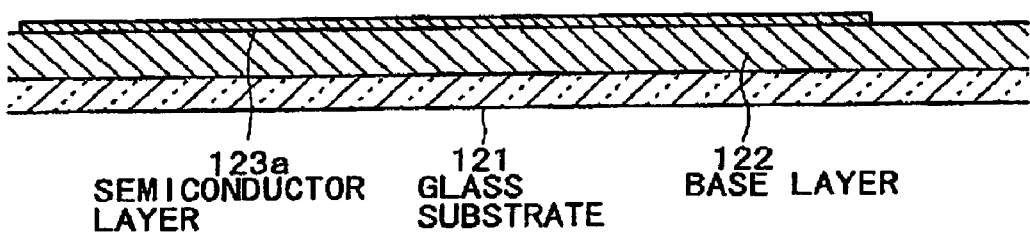
FIGS. 8A, 8B, and 8C are sectional views of assistance in explaining a method of manufacturing a conventional display device having a top gate structure.
Figure 8B:
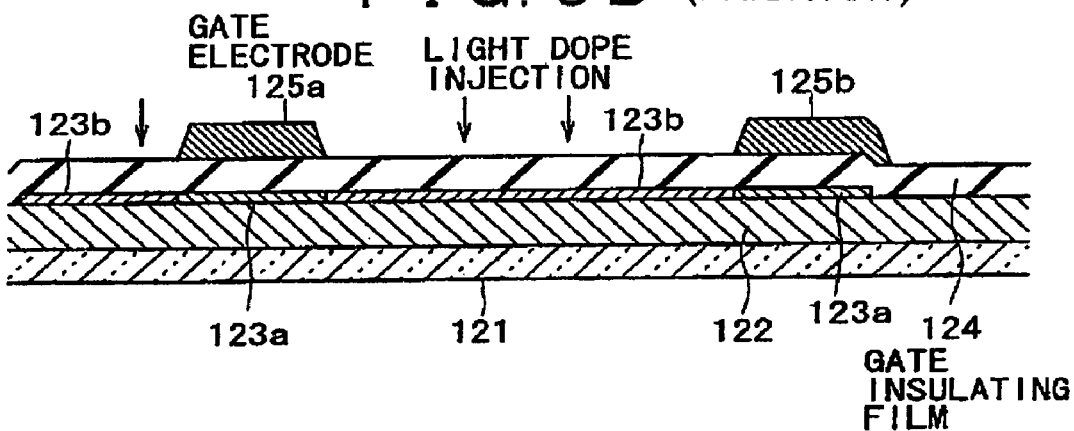
Figure 8C:
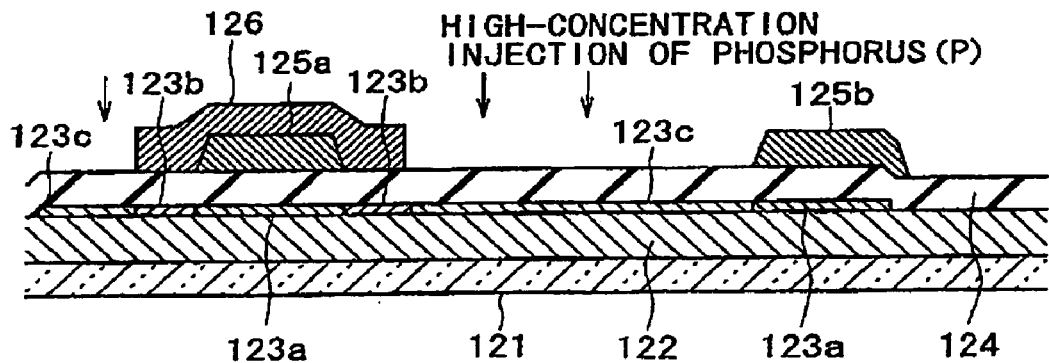

Following the process of FIG. 8B, in FIG. 20A, a resist 47a having such a shape as to cover the LDD region on both sides of the channel region 45 is formed in the TFT transistor region. Then, phosphorus is injected at a high concentration in the vicinity of the TFT transistor to thereby form the $N^+$ type semiconductor region 43 and thus metalize the semiconductor layer.

At this time, a resist 47b is formed so as to prevent the high-concentration injection of phosphorus in the vicinity of the auxiliary capacitance. Thus, as in FIG. 8B, an $N^−$ type semiconductor region 44a is formed around the auxiliary capacitance after the high-concentration injection of phosphorus.

In FIG. 20B, the resist 47b in the vicinity of the auxiliary capacitance is removed, and boron is injected at a high concentration around the auxiliary capacitance to thereby form a $P^+$ type semiconductor region 44b. At this time, a resist 47c is formed so as to prevent the high-concentration injection of boron in the vicinity of the TFT transistor.

Thereafter heat treatment is performed as required to activate doped elements.

The fourth embodiment has the same effects as the first and second embodiments.

While the present invention has been described above on the basis of the preferred embodiments, the present invention is not limited to the embodiments described above and is susceptible of various modifications without departing from the spirit of the present invention.

While the foregoing embodiments have been described by taking a liquid crystal display device as an example, the present invention is applicable to other display devices having a similar driving method.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a display device, said method comprising:
    forming a conductive first scanning line and a conductive second scanning line arranged in parallel with each other,
    forming a first insulating film over said first scanning line and said second scanning line, and
    forming a semiconductor film over said first insulating film;
    forming a first protective mask for protecting a first channel region of said semiconductor film and a storage capacitance region of said semiconductor film, the first channel region being opposed to said first scanning line; and injecting an impurity of a first conduction type into a switching element region for forming at least a portion of a switching element in said semiconductor film, forming a second protective mask for protecting the switching element region of said semiconductor film; and injecting an impurity of a second conduction type opposite the first conduction type into a storage capacitance region for forming at least a portion of a storage capacitance element in said semiconductor film, wherein the semiconductor film is a continuous body of material extending from the storage capacitance element to said switching element, further comprising forming a metal interconnect between at least a portion of said switching element region and a portion of said storage capacitance region, and wherein the metal interconnect provides an electrical connection between different portions of a conductive region extending from the switching element region to the storage capacitance region, and further wherein the storage capacitance element is comprised of a portion of the second scanning line and a portion of the semiconductor film adjacent to the portion of the second scanning line, the portions of the second scanning line and the semiconductor film being separated by the first insulating film, said method further comprising:

forming a second insulating film over the semiconductor film having said switching element region and said storage capacitance region injected with the impurity of the first conduction type and the impurity of the second conduction type, respectively;

forming, in said second insulating film, a first contact hole and a third contact hole reaching semiconductor regions of the first conduction type;

forming, in said second insulating film, a second contact hole reaching a semiconductor region of the second conduction type;

connecting the semiconductor region of the first conduction type on one side of said first scanning line with the semiconductor region of the second conduction type on one side of said second scanning line by depositing a conductive material in said first contact hole and said second contact hole; and forming a data signal line by depositing a conductive material in said third contact hole.

2. The method of manufacturing a display device as set forth in claim 1,
wherein said first contact hole is formed integrally with said second contact hole.

3. The method of manufacturing a display device as set forth in claim 1,
wherein the conductive material deposited in said first contact hole and said second contact hole is a same material as the conductive material deposited in said third contact hole.

4. A method of manufacturing a display device, said method comprising:

forming a conductive first scanning line and a conductive second scanning line arranged in parallel with each other;

forming a first insulating film over said first scanning line and said second scanning line, and forming a semiconductor film over said first insulating film extending from a switching element region to a storage capacitance region, wherein the semiconductor film is formed as a continuous body of material extending from the storage capacitance element to said switching element and a region of the semiconductor film between the storage capacitance element and the switching element has a first portion which is doped with a first conductivity impurity and a second portion which is doped with a second conductivity impurity that is opposite the first conductivity impurity; and forming a conductive body of material connecting the first and second portions of the semiconductor film, and wherein the conductive body provides an electrical connection between different portions of a conductive region extending from the switching element region to the storage capacitance region.

* * * * *